(12) United States Patent
Wang et al.

(10) Patent No.: US 11,916,110 B2
(45) Date of Patent: Feb. 27, 2024

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Chih-Ching Wang, Kinmen (TW); Wei-Yang Lee, Taipei (TW); Ming-Chang Wen, Kaohsiung (TW); Jo-Tzu Hung, Hsinchu (TW); Wen-Hsing Hsieh, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/857,104

(22) Filed: Jul. 4, 2022

(65) Prior Publication Data

US 2022/0352319 A1 Nov. 3, 2022

Related U.S. Application Data

(62) Division of application No. 17/027,302, filed on Sep. 21, 2020, now Pat. No. 11,387,322.

(51) Int. Cl.
*H01L 29/10* (2006.01)
*H01L 29/423* (2006.01)
(Continued)

(52) U.S. Cl.
CPC ...... *H01L 29/1033* (2013.01); *H01L 29/4238* (2013.01); *H01L 29/66818* (2013.01); *H01L 29/785* (2013.01); *H01L 2029/7858* (2013.01)

(58) Field of Classification Search
CPC ......... H01L 2029/7858; H01L 29/0673; H01L 29/42392; H01L 29/0665; H01L 29/1033;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Changhyun Yi
(74) *Attorney, Agent, or Firm* — NZ CARR LAW OFFICE

(57) ABSTRACT

Embodiments of the present disclosure provide a method for forming semiconductor device structures. The method includes forming a fin structure having a stack of semiconductor layers comprising first semiconductor layers and second semiconductor layers alternatingly arranged, forming a sacrificial gate structure over a portion of the fin structure, removing the first and second semiconductor layers in a source/drain region of the fin structure that is not covered by the sacrificial gate structure, forming an epitaxial source/drain feature in the source/drain region, removing portions of the sacrificial gate structure to expose the first and second semiconductor layers, removing portions of the second semiconductor layers so that at least one second semiconductor layer has a width less than a width of each of the first semiconductor layers, forming a conformal gate dielectric layer on exposed first and second semiconductor layers, and forming a gate electrode layer on the conformal gate dielectric layer.

20 Claims, 22 Drawing Sheets

(51) Int. Cl.
*H01L 29/66* (2006.01)
*H01L 29/78* (2006.01)

(58) Field of Classification Search
CPC ........... H01L 29/66818; H01L 29/4238; H01L 29/785; H01L 29/1054; H01L 29/7853; H01L 29/78696; H01L 27/0886; H01L 29/1037
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0054035 A1* | 2/2017 | Cheng ................. H01L 27/0886 |
| 2017/0256609 A1* | 9/2017 | Bhuwalka ......... H01L 29/78696 |

\* cited by examiner

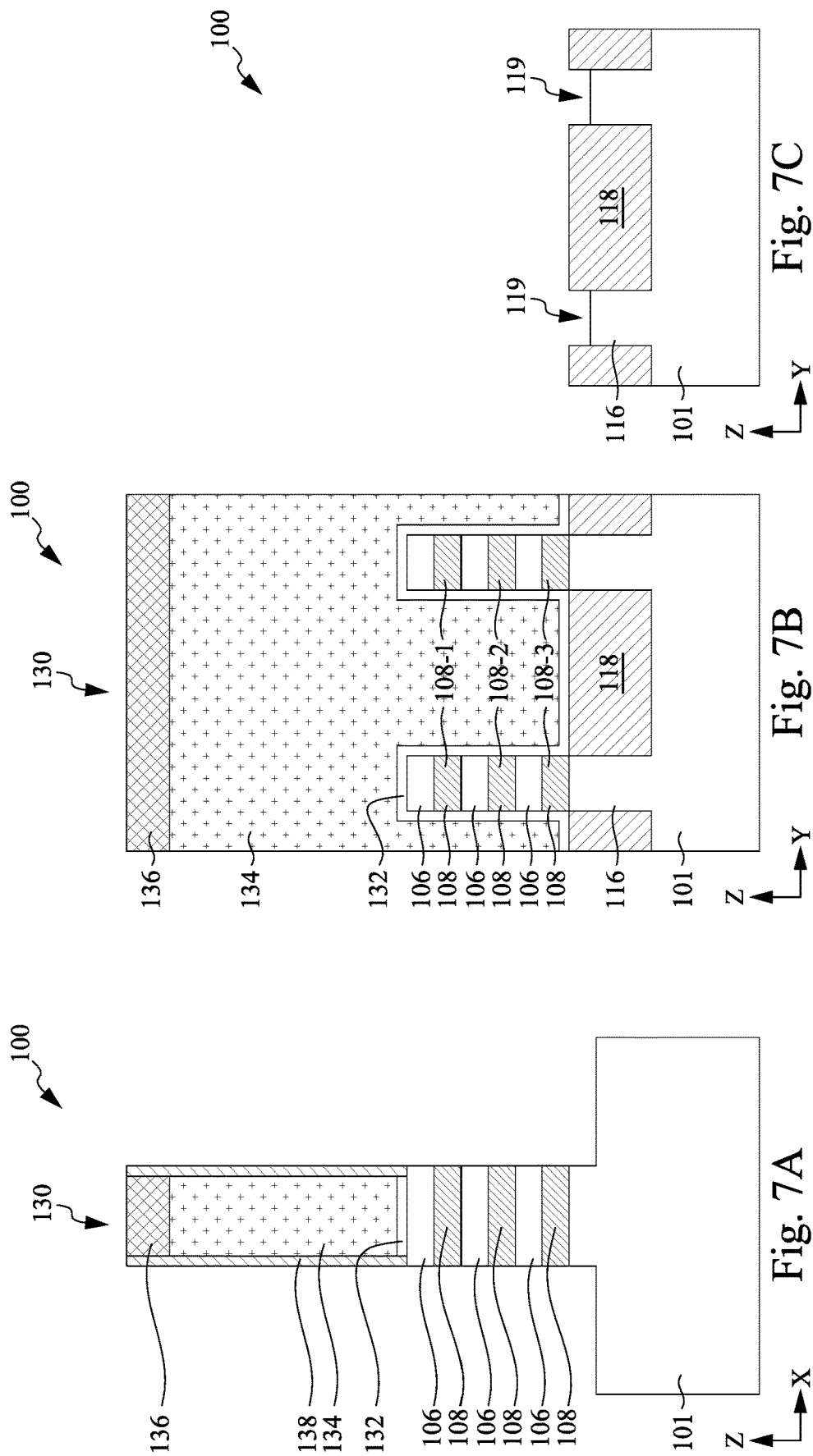

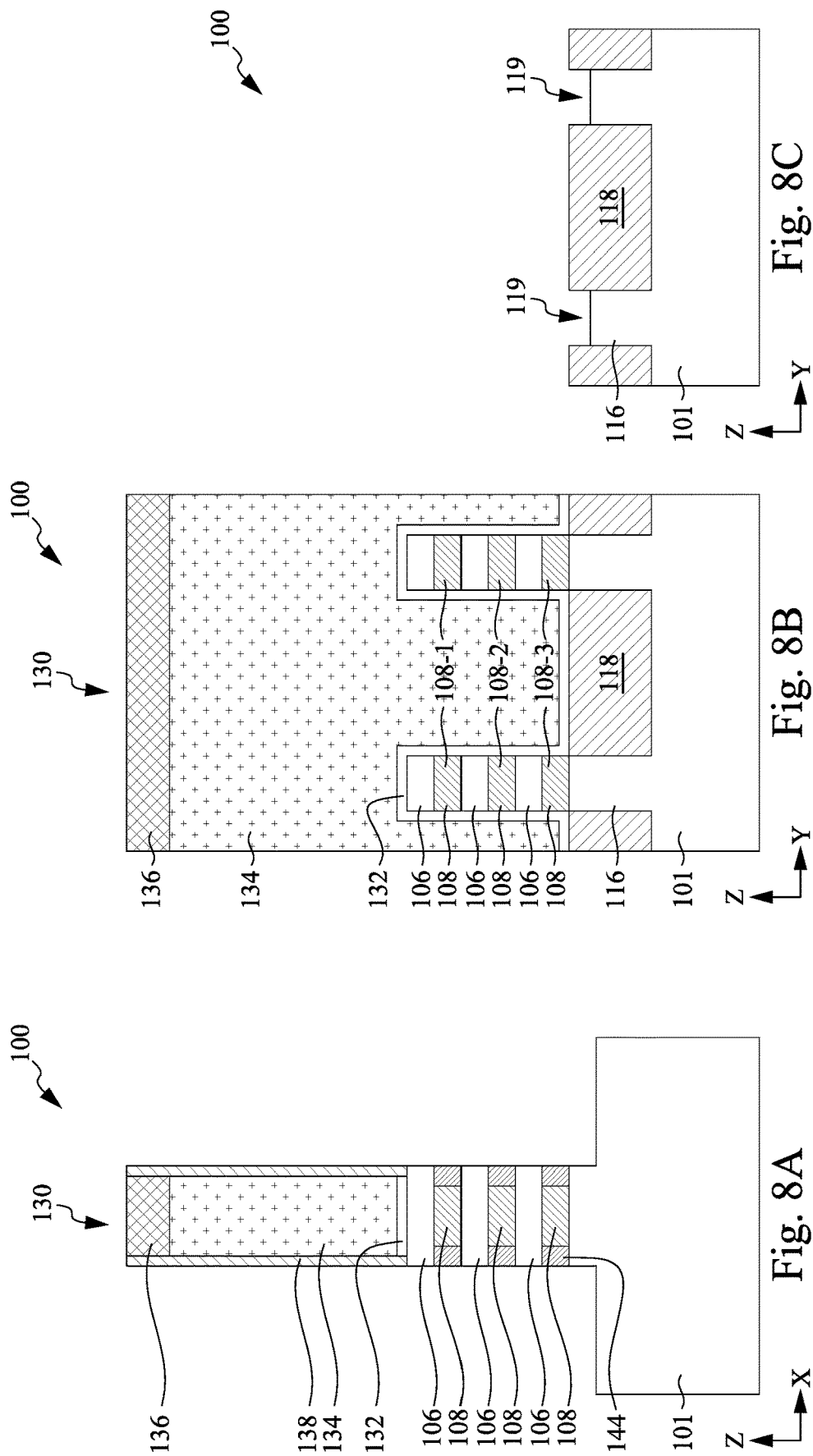

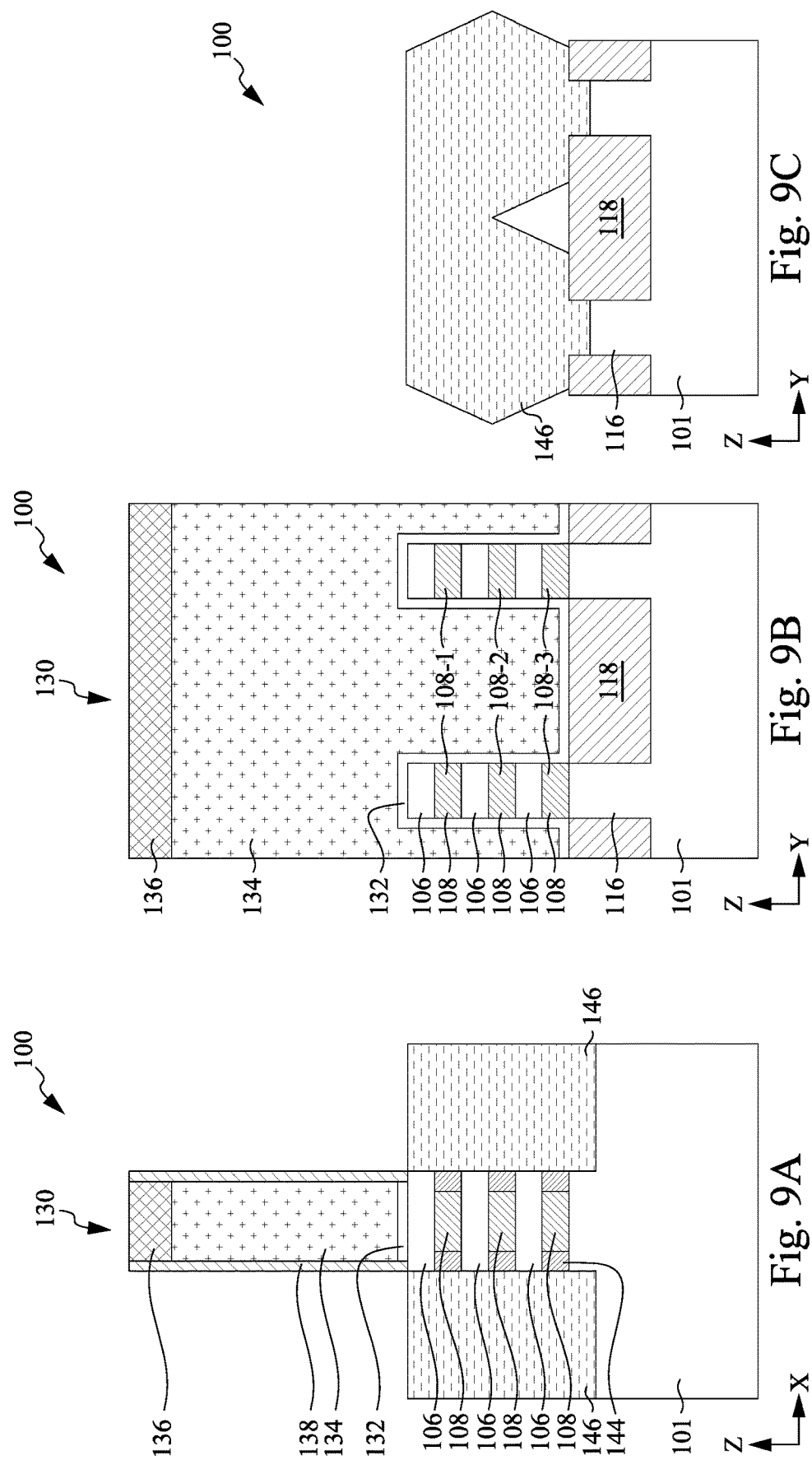

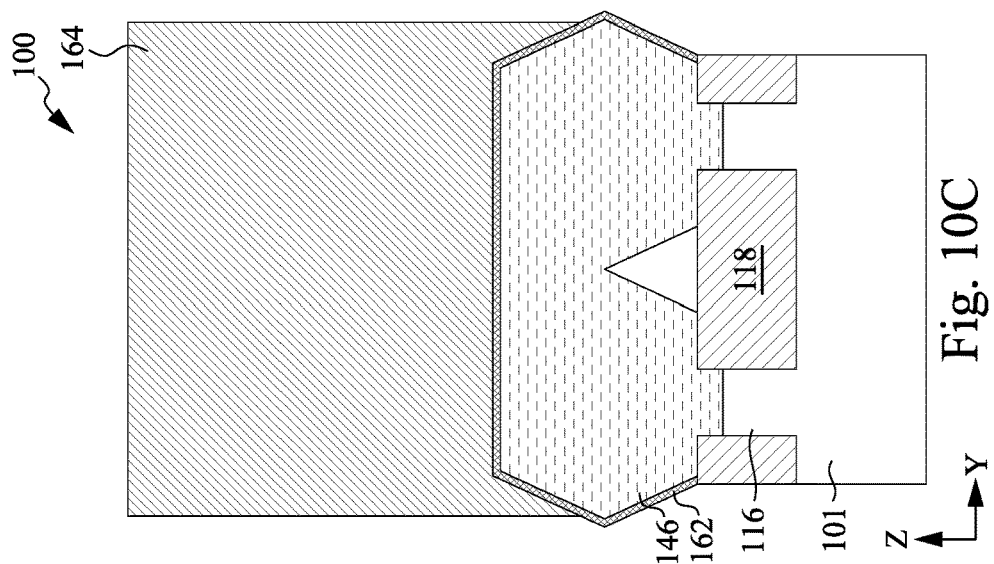
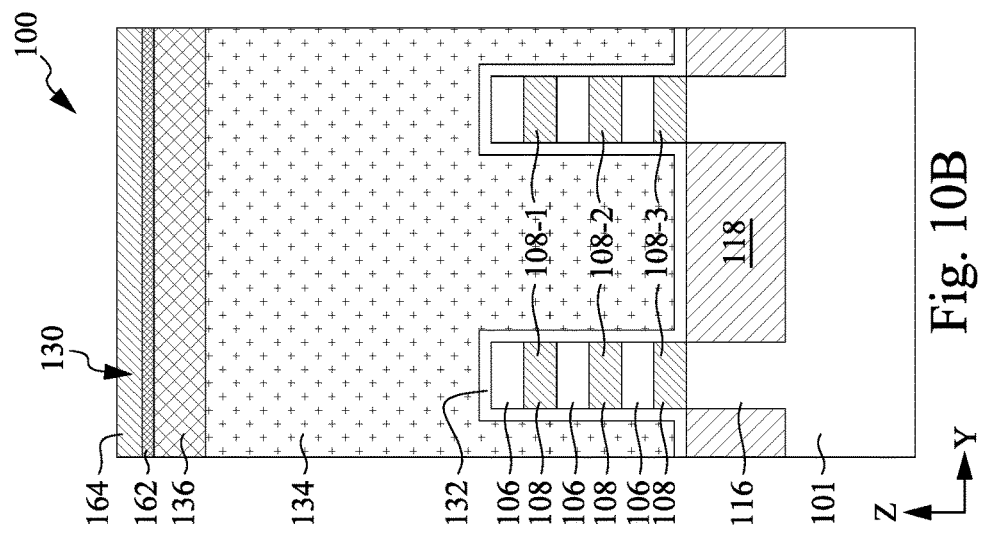
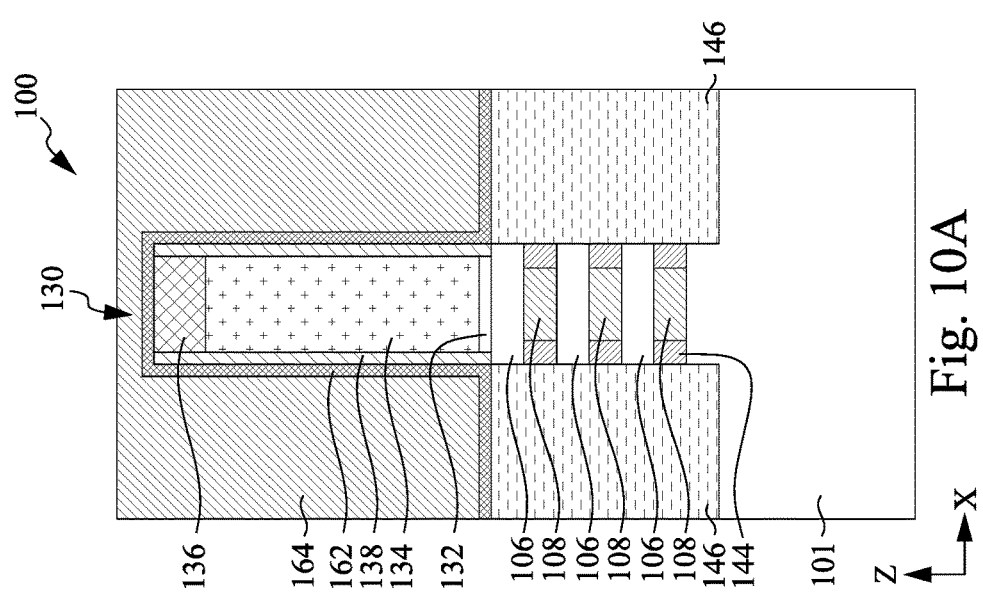

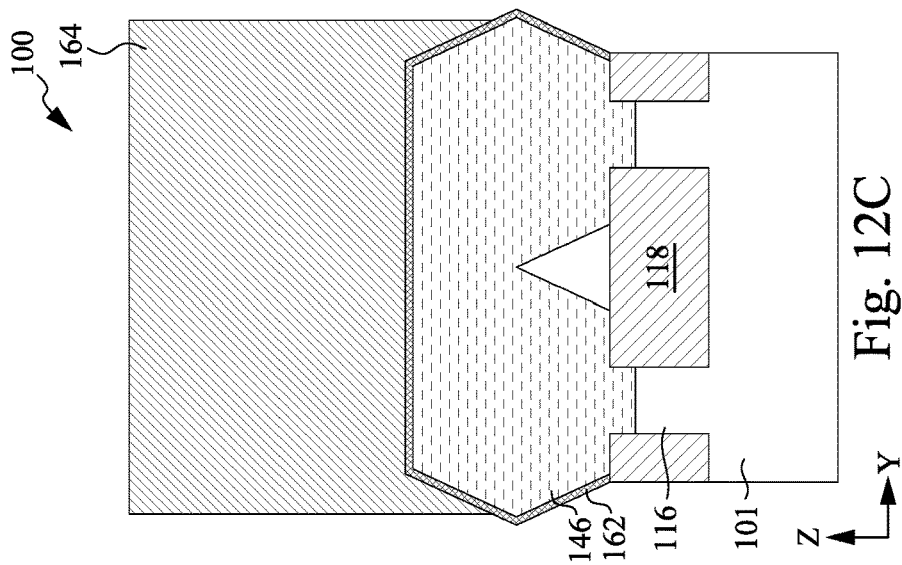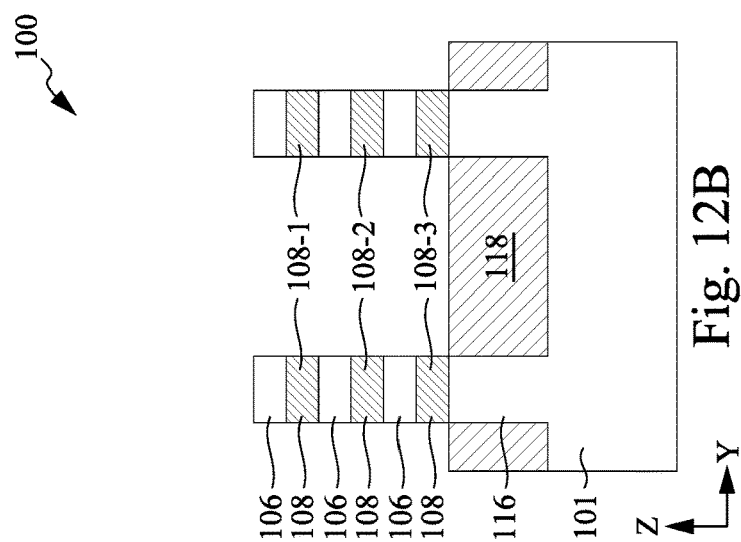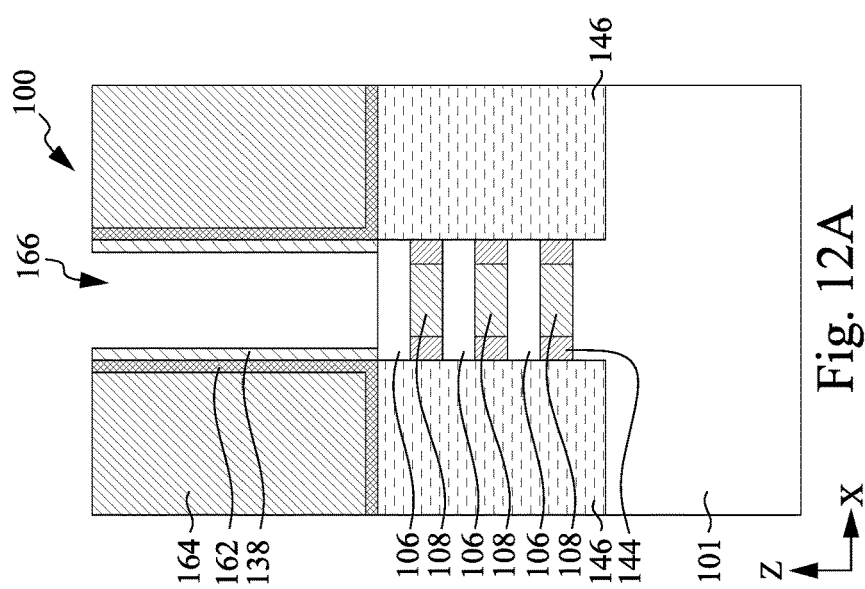

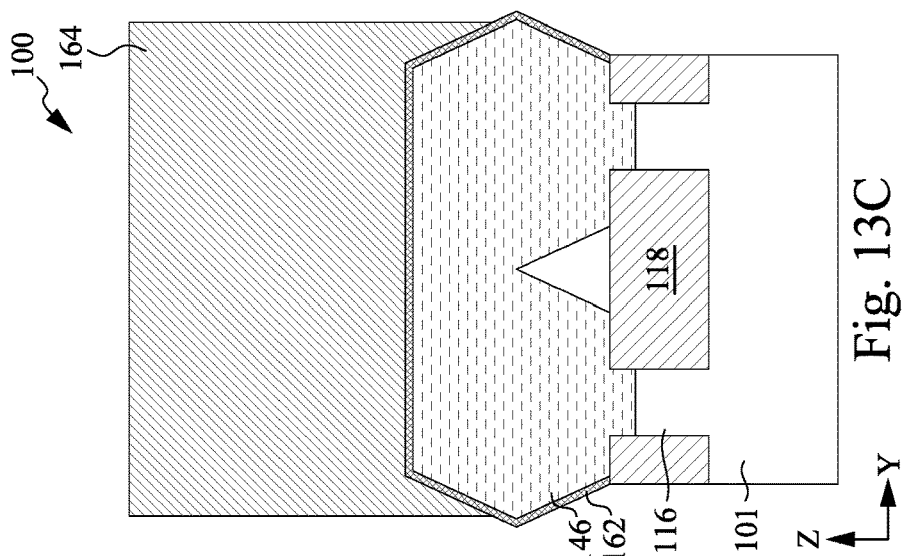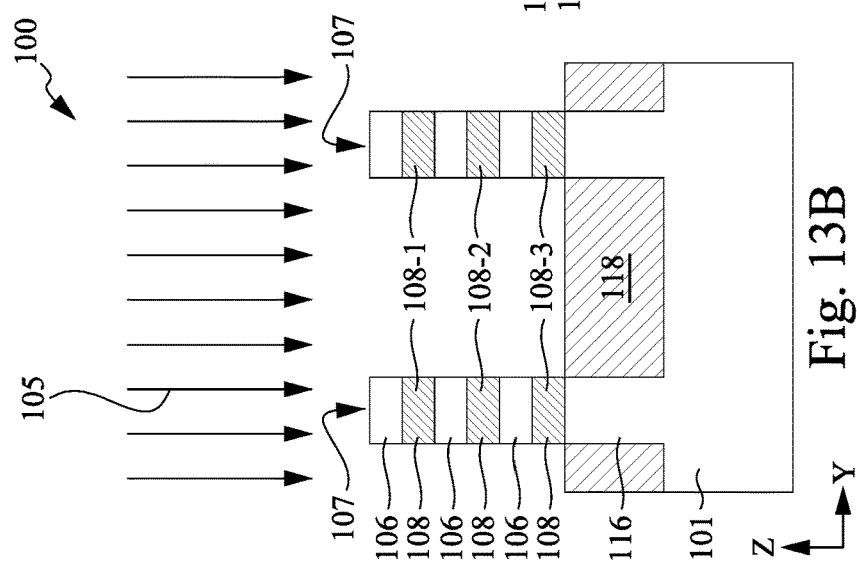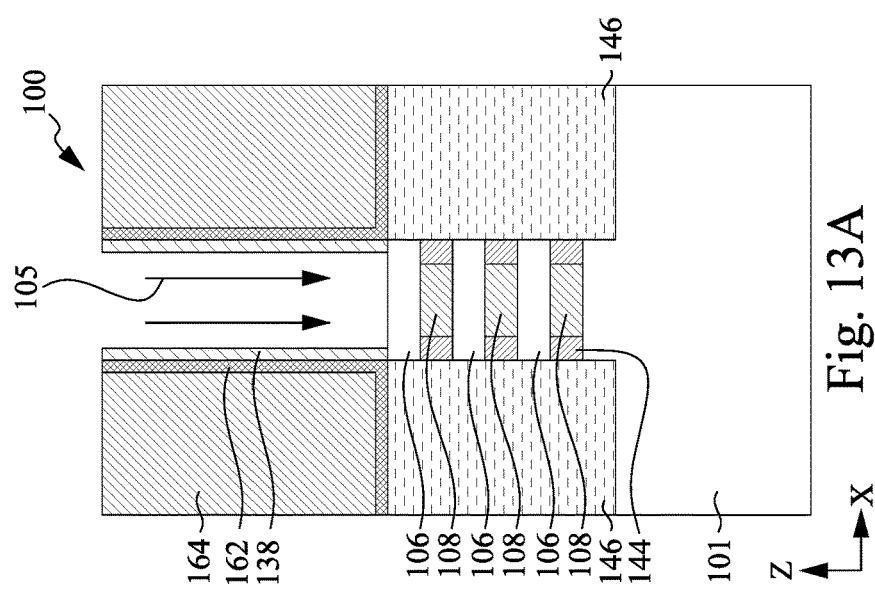

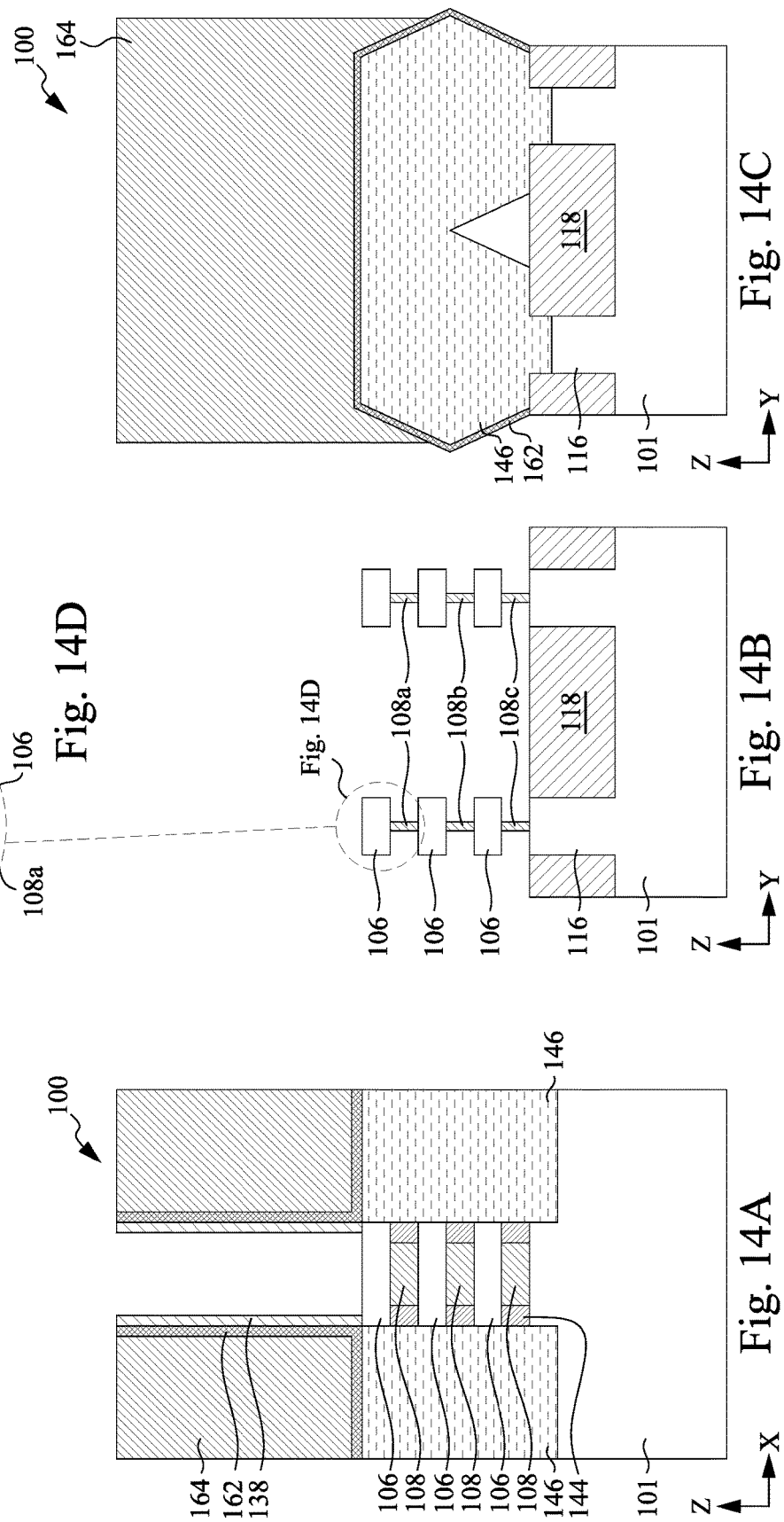

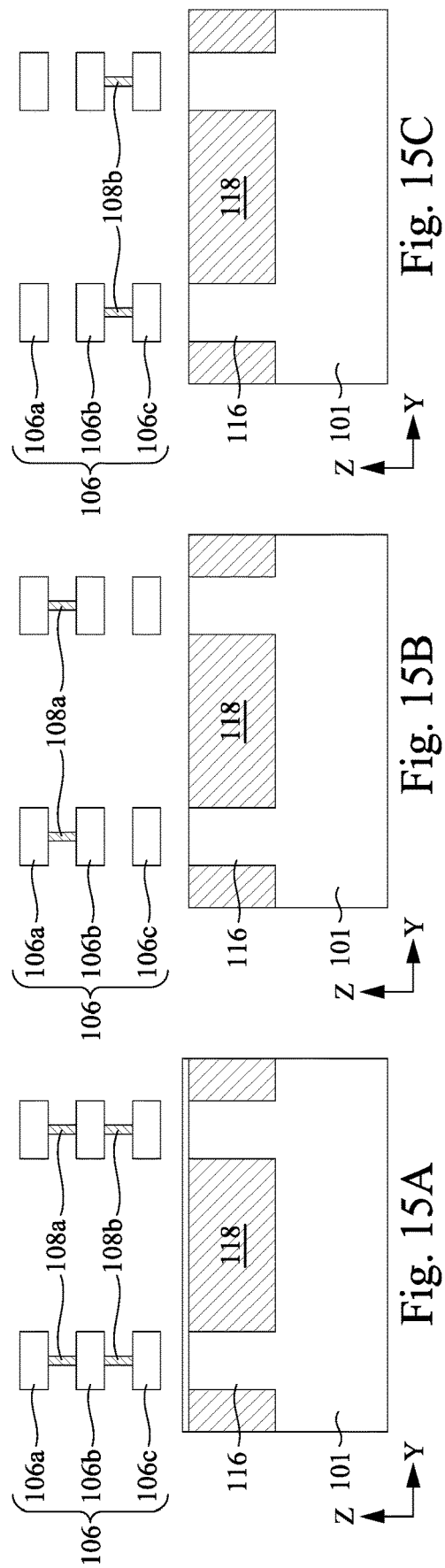

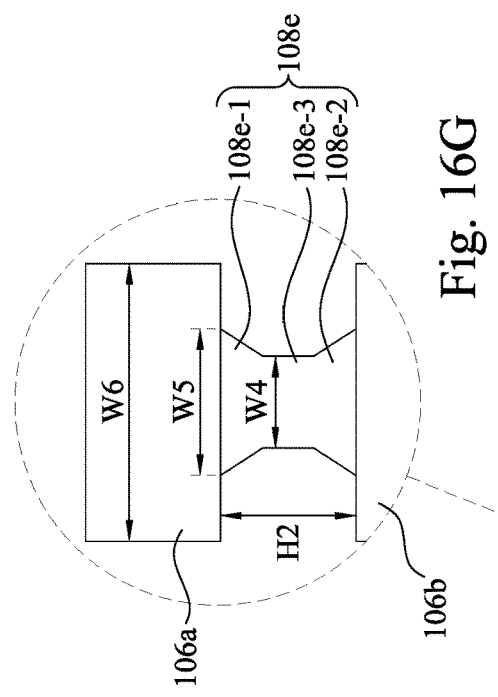
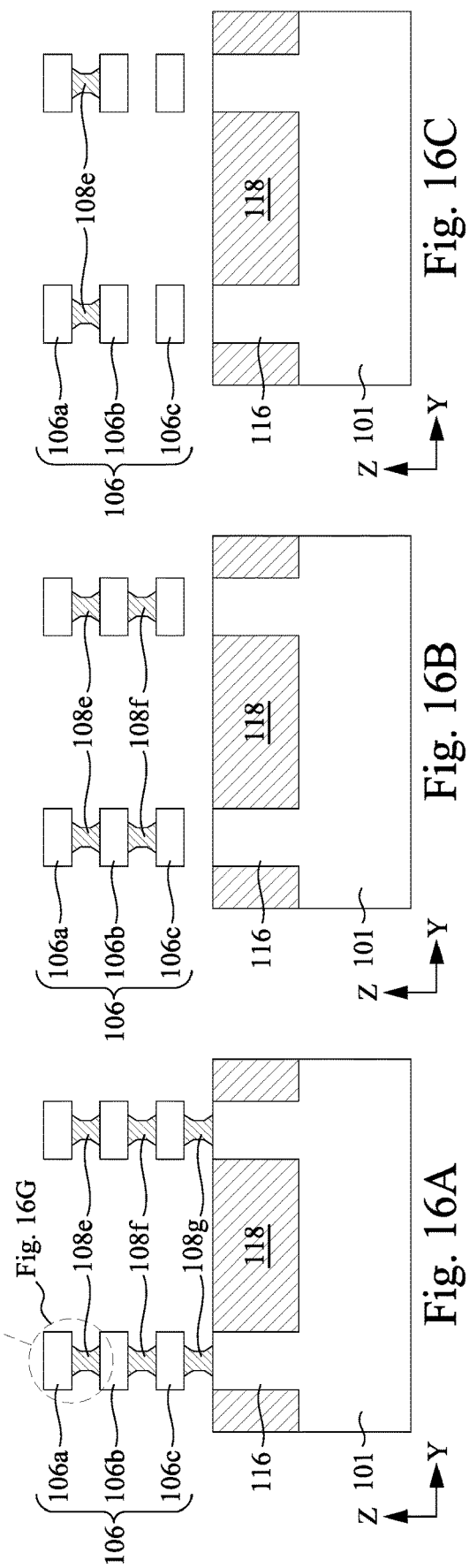
Fig. 16G
Fig. 16C
Fig. 16B
Fig. 16A

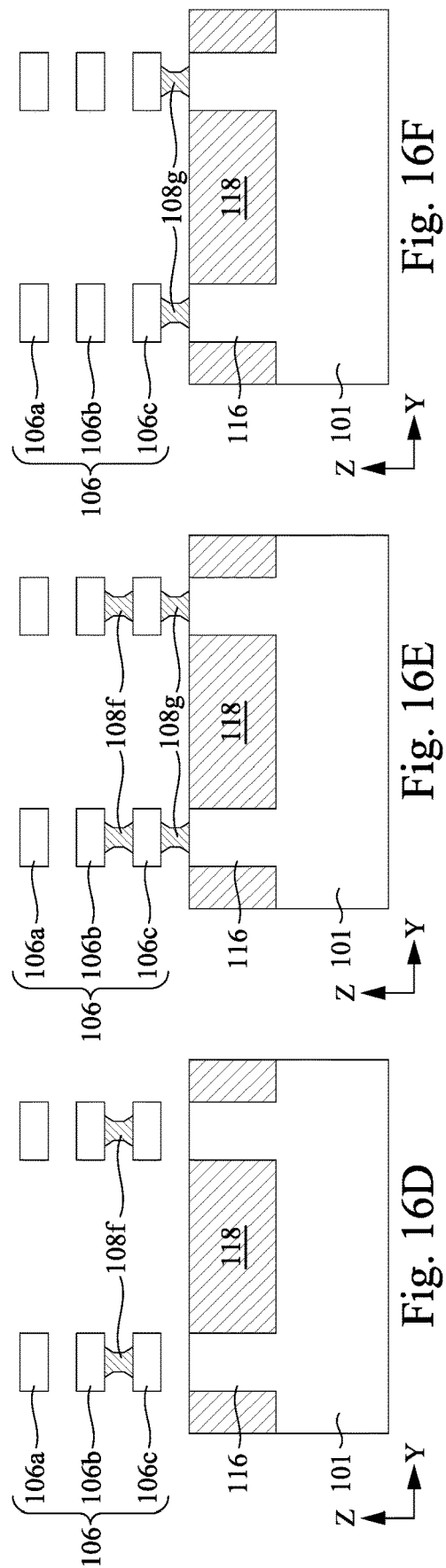

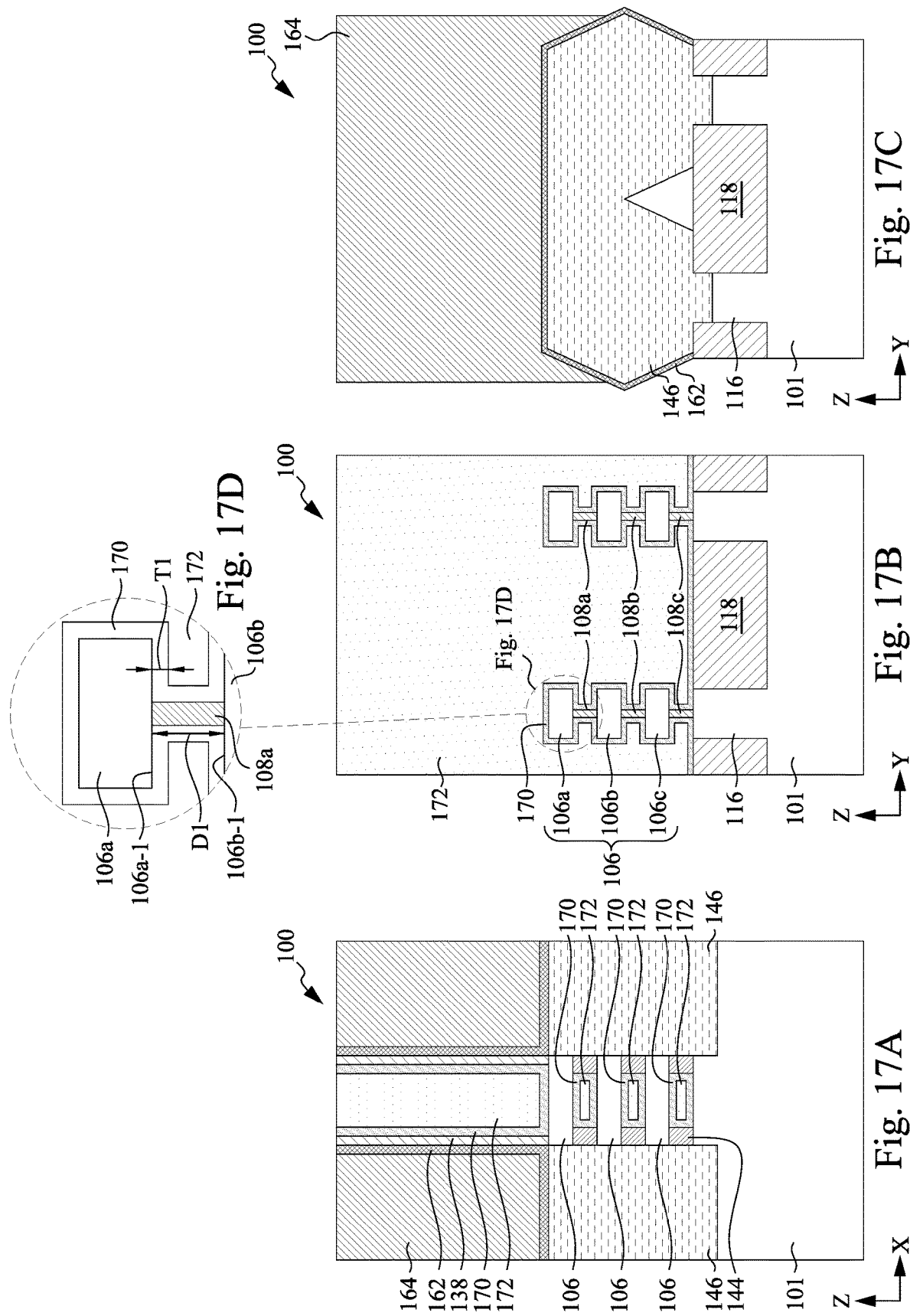

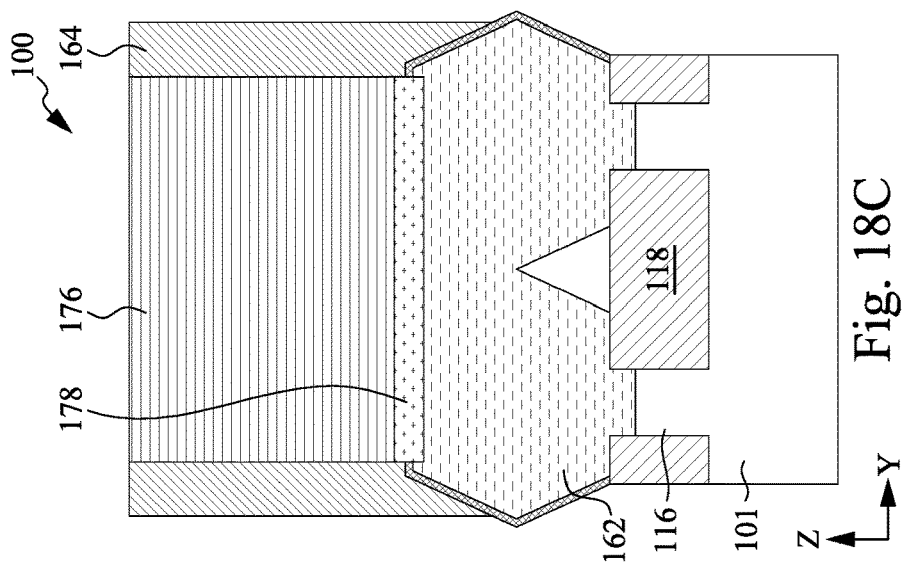
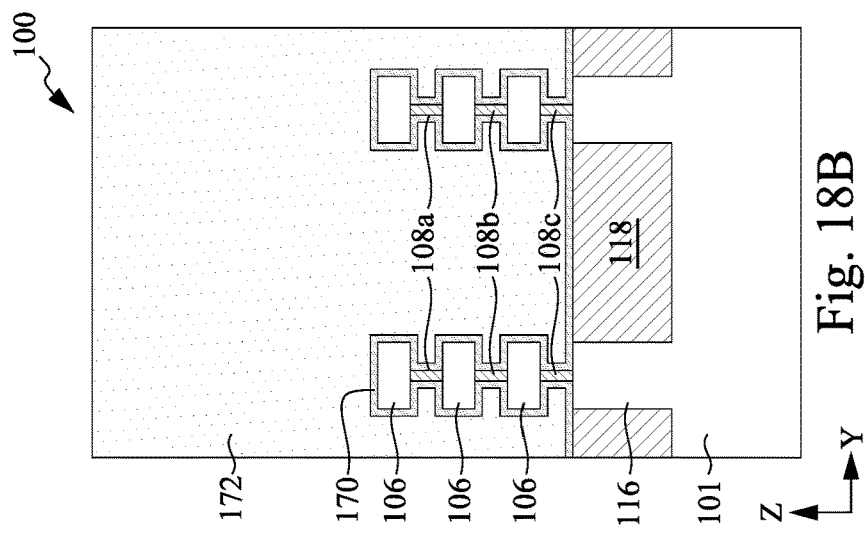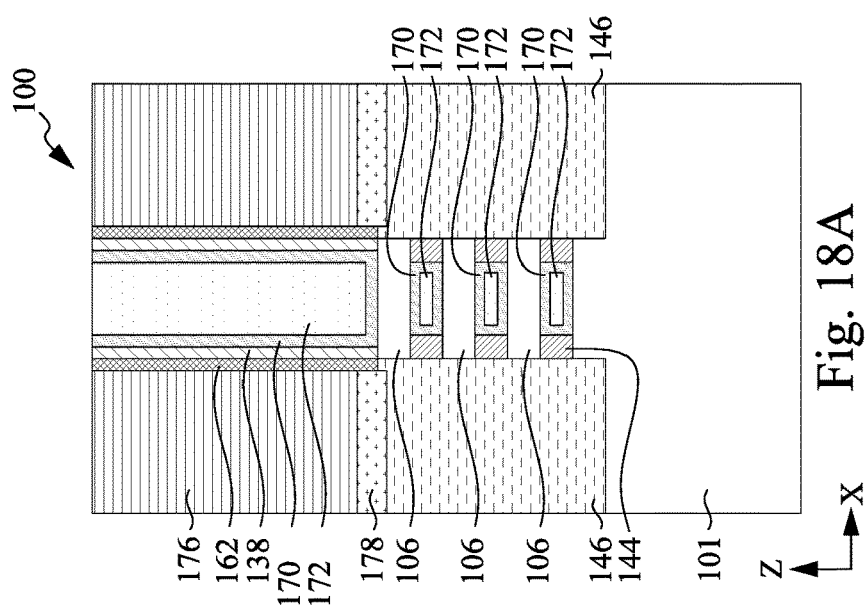

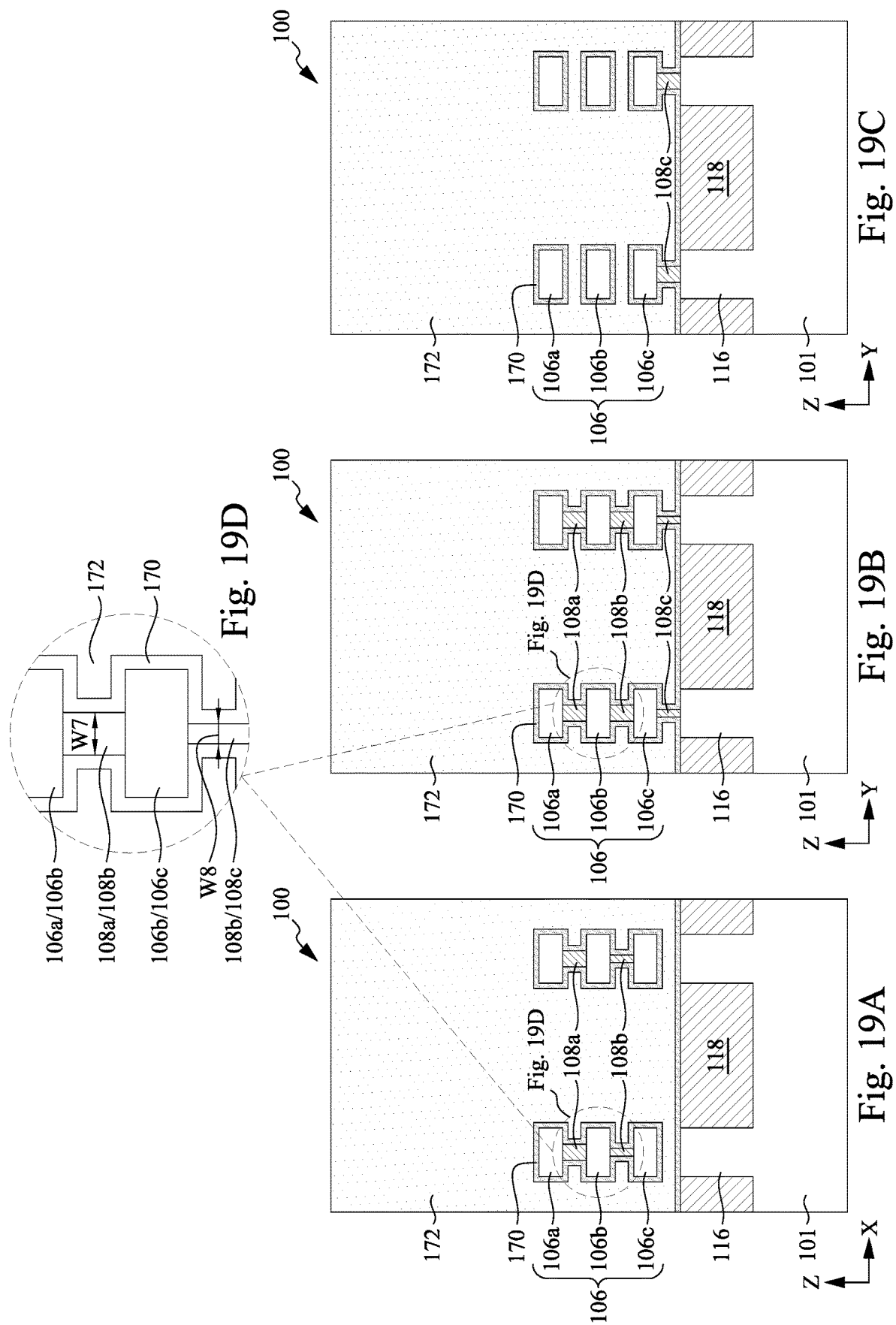

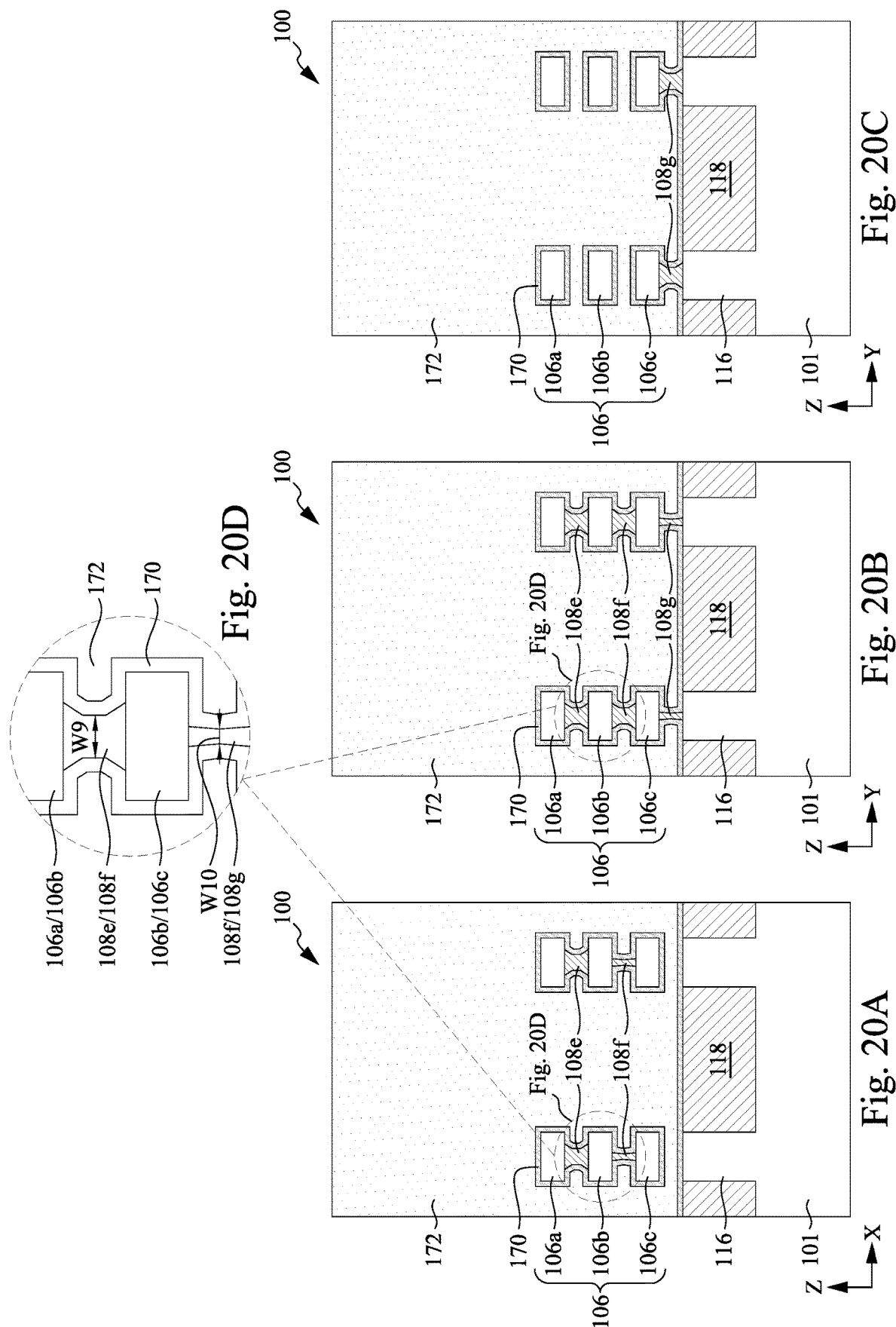

SEMICONDUCTOR DEVICE HAVING NANOSHEET TRANSISTOR AND METHODS OF FABRICATION THEREOF

CROSS-REFERENCE TO RELATED APPLICATIONS

This application is a divisional application of U.S. patent application Ser. No. 17/027,302 filed Sep. 21, 2020, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to improve carrier mobility and drive current in a device. As device size reduces, the drive current in the nanowire transistors has also reached a limit due to the reduction of the channel width for greater device density.

Therefore, there is a need to improve processing and manufacturing ICs

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 7C to 14A, 14B, 14C are cross-sectional side views of one of various stages of manufacturing the semiconductor device structure taken along line A-A, line B-B, and line C-C of FIG. 6, respectively.

FIG. 14D shows an enlarged view of a portion of first and second semiconductor layers shown in FIG. 14B.

FIGS. 15A-15E are cross-sectional side views of the semiconductor device structure taken along line B-B of FIG. 6, showing various embodiments of the second semiconductor layer after a removal process.

FIGS. 16A-16F are cross-sectional side views of the semiconductor device structure taken along line B-B of FIG. 6, showing various embodiments of the second semiconductor layer after a removal process.

FIG. 16G is an enlarged view of a portion of first and second semiconductor layers shown in FIG. 16A.

FIGS. 17A, 17B, 17C to 18A, 18B, 18C are cross-sectional side views of one of various stages of manufacturing the semiconductor device structure taken along line A-A, line B-B, and line C-C of FIG. 6, respectively.

FIG. 17D is an enlarged view of a portion of first and second semiconductor layers shown in FIG. 17B.

FIGS. 19A-19C illustrate cross-sectional side views of one of various stages of manufacturing the semiconductor device structure taken along line B-B of FIG. 6 in accordance with some embodiments.

FIG. 19D is an enlarged view of a portion of first semiconductor layer and recessed second semiconductor layers shown in FIG. 19A or 19B.

FIGS. 20A-20C illustrate cross-sectional side views of one of various stages of manufacturing the semiconductor device structure taken along line B-B of FIG. 6 in accordance with some embodiments.

FIG. 20D is an enlarged view of a portion of first semiconductor layer and recessed second semiconductor layers shown in FIG. 20A or 20B.

DETAILED DESCRIPTION

Figure 1:
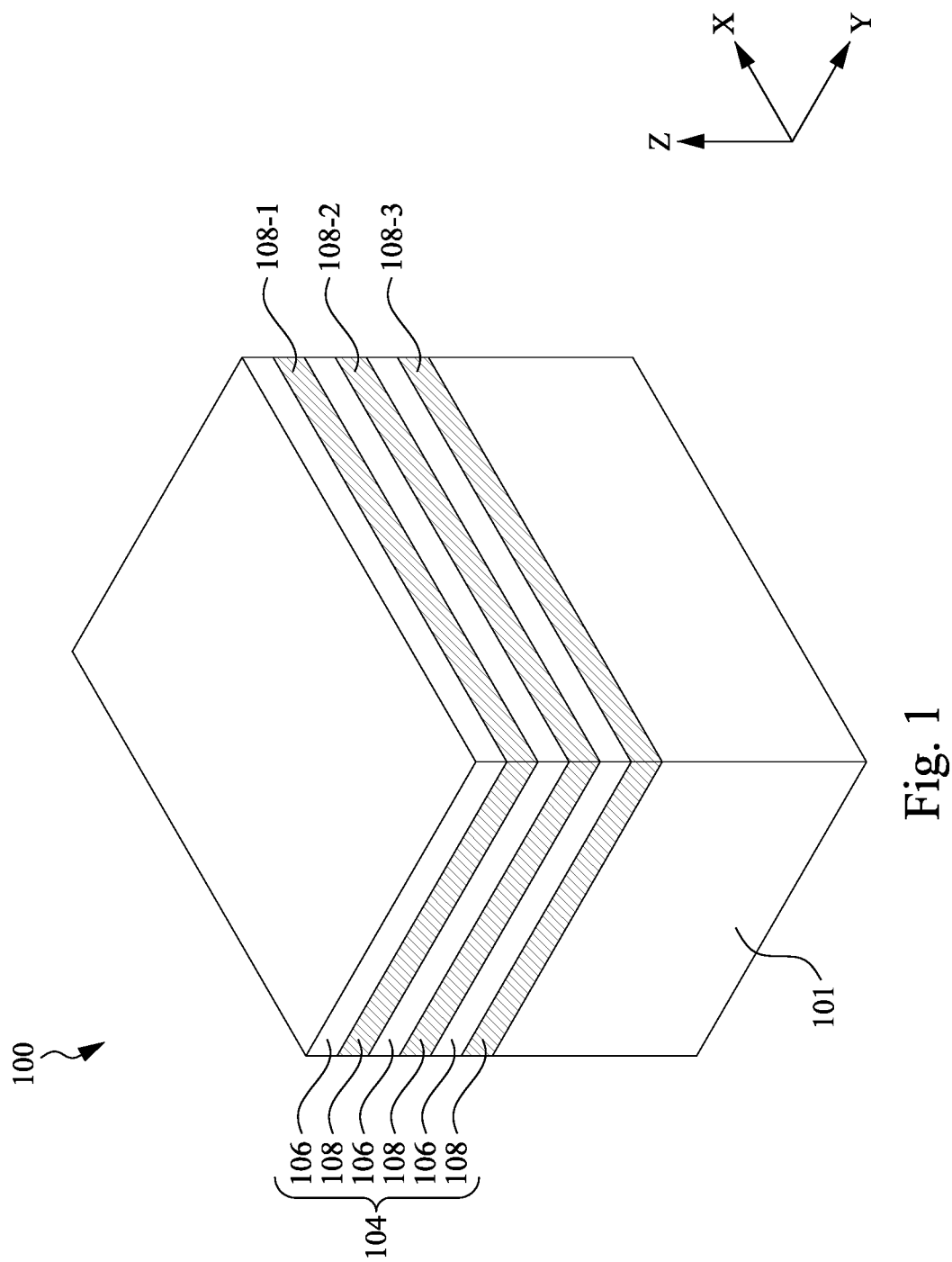
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having at least one T-shaped stacked nanosheet transistor to provide increased effective conductive area across the channel regions. For gate all around (GAA) transistors, such as nanosheet FETs, a stack of semiconductor layers including alternating first and second semiconductor layers is formed over a substrate. The first semiconductor layers, which form nanosheet channel(s) of the semiconductor device structure, are connected by the second semiconductor layers. Conventionally, the second semiconductor layers are removed so that the first semiconductor layers in the channel regions are wrapped around by a gate electrode. According to embodiments of the present disclosure, the second semiconductor layers, which interpose between the first semiconductor layers, are recessed laterally during formation of GAA transistors so that at least a pair of the first semiconductor layer and the recessed second semiconductor layer have a T-shaped profile in a cross-sectional view. The vertical section of T-shaped structure provides additional conductive area for effective control of the nanosheet channels of the semiconductor device structure. As a result, the drive current can be increased without being limited by the channel width or length when scaling down.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-20D show exemplary processes for manufacturing a semiconductor device structure 100 according to embodiments of the present disclosure. It is understood that additional operations can be provided before, during, and after processes shown by FIGS. 1-20D, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example boron for an n-type field effect transistors (NFET) and phosphorus for a p-type field effect transistors (PFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

As will be described in more detail below, portions of the second semiconductor layers 108 are eventually removed so that the recessed second semiconductor layers 108 remain between the first semiconductor layers 106 to provide additional conductive area for effective control of the nanosheet channels of the semiconductor device structure. It has been observed that the second semiconductor layers 108 having higher Ge percentages (atomic percentage) will have higher etch rates than the second semiconductor layers 108 having lower Ge percentages. In cases where three second semiconductor layers 108 are formed of SiGe and are alternately arranged between the first semiconductor layers 106 in the stack of semiconductor layers 104, the Ge atomic percentage of SiGe can be selected to vary the etch rate of the second semiconductor layers 108 with the etchant, thereby controlling the width of the second semiconductor layers 108 and selectively preserving the second semiconductor layers 108 between the first semiconductor layers 106. Various examples of the recessed second semiconductor layers 108 profile are shown and discussed with respect to FIGS. 14B, 15A-15E, 16A-16G, 19A-19C, and 20A-20C.

In one embodiment, which is referred to herein as embodiment A01 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 similar or identical to GP1, and the second semiconductor layer 108 at the lower region of the stack of the semiconductor layers 104 (e.g., the second semiconductor layer 108-3) has a third Ge atomic percentage GP3 that is similar or identical to GP1 and GP2. For example, the first Ge atomic percentage GP1 may be in a range between about 5 atomic percent (at. %) and about 25 at. %, the second Ge atomic percentage GP2 may be in a range between about 5 at. % and about 25 at. %, and the third Ge atomic percentage GP3 may be in a range between about 5 at. % and about 25 at. %.

In one embodiment, which is referred to herein as embodiment A02 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 similar or identical to GP1, and the second semiconductor layer 108 at the lower region of the stack of the semiconductor layers 104 (e.g., the second semiconductor layer 108-3) has a third Ge atomic percentage GP3 that is greater than GP1 and GP2. For example, the first Ge atomic percentage GP1 may be in a range between about 5 at. % and about 25 at. %, the second Ge atomic percentage GP2 may be in a range between about 5 at. % and about 25 at. %, and the third Ge atomic percentage GP3 may be a range between about 15 at. % and about 50 at. %, such as between about 26 at. % and about 50 at. %.

In one embodiment, which is referred to herein as embodiment A03 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 greater than GP1, and the second semiconductor layer 108 at the lower region of the stack of the semiconductor layers 104 (e.g., the second semiconductor layer 108-3) has a third Ge atomic percentage GP3 that is similar or identical to GP2. For example, the first Ge atomic percentage GP1 may be in a range between about 5 at. % and about 25 at. %, the second Ge atomic percentage GP2 may be in a range between about 15 at. % and about 50 at. %, such as between about 26 at. % and about 50 at. %, and the third Ge atomic percentage GP3 may be a range between about 15 at. % and about 50 at. %, such as between about 26 at. % and about 50 at. %.

In one embodiment, which is referred to herein as embodiment A04 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 greater than GP1, and the second semiconductor layer 108 at the lower region of the stack of the semiconductor layers 104 (e.g., the second semiconductor layer 108-3) has a third Ge atomic percentage GP3 that is similar or identical to GP1. For example, the first Ge atomic percentage GP1 may be in a range between about 5 at. % and about 25 at. %, the second Ge atomic percentage GP2 may be in a range between about 15 at. % and about 50 at. %, such as between about 26 at. % and about 50 at. %, and the third Ge atomic percentage GP3 may be a range between about 5 at. % and about 25 at. %.

In one embodiment, which is referred to herein as embodiment A05 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 less than GP1, and the second semiconductor layer 108 at the lower region of the stack of the semiconductor layers 104 (e.g., the second semiconductor layer 108-3) has a third Ge atomic percentage GP3 that is similar or identical to GP2. For example, the first Ge atomic percentage GP1 may be in a range between about 15 at. % and about 50 at. %, the second Ge atomic percentage GP2 may be in a range between about 5 at. % and about 25 at. %, such as between about 5 at. % and about 14 at. %, and the third Ge atomic percentage GP3 may be a range between about 5 at. % and about 25 at. %, such as between about 5 at. % and about 14 at. %.

In one embodiment, which is referred to herein as embodiment A06 in this disclosure, the second semiconductor layer 108 at the upper region of the stack of the semiconductor layers 104 (e.g., the second semiconductor layer 108-1) has a first Ge atomic percentage GP1, the second semiconductor layer 108 at the middle region of the stack of the semiconductor layers 104 (e.g., the second semiconductor layer 108-2) has a second Ge atomic percentage GP2 similar or identical to GP1, and the second semiconductor layer 108 at the lower region of the stack of the semiconductor layers 104 (e.g., the second semiconductor layer 108-3) has a third Ge atomic percentage GP3 that is less than GP2. For example, the first Ge atomic percentage GP1 may be in a range between about 15 at. % and about 50 at. %, the second Ge atomic percentage GP2 may be in a range between about 15 at. % and about 50 at. %, and the third Ge atomic percentage GP3 may be a range between about 5 at. % and about 25 at. %, such as between about 5 at. % and about 14 at. %.

Figure 2:
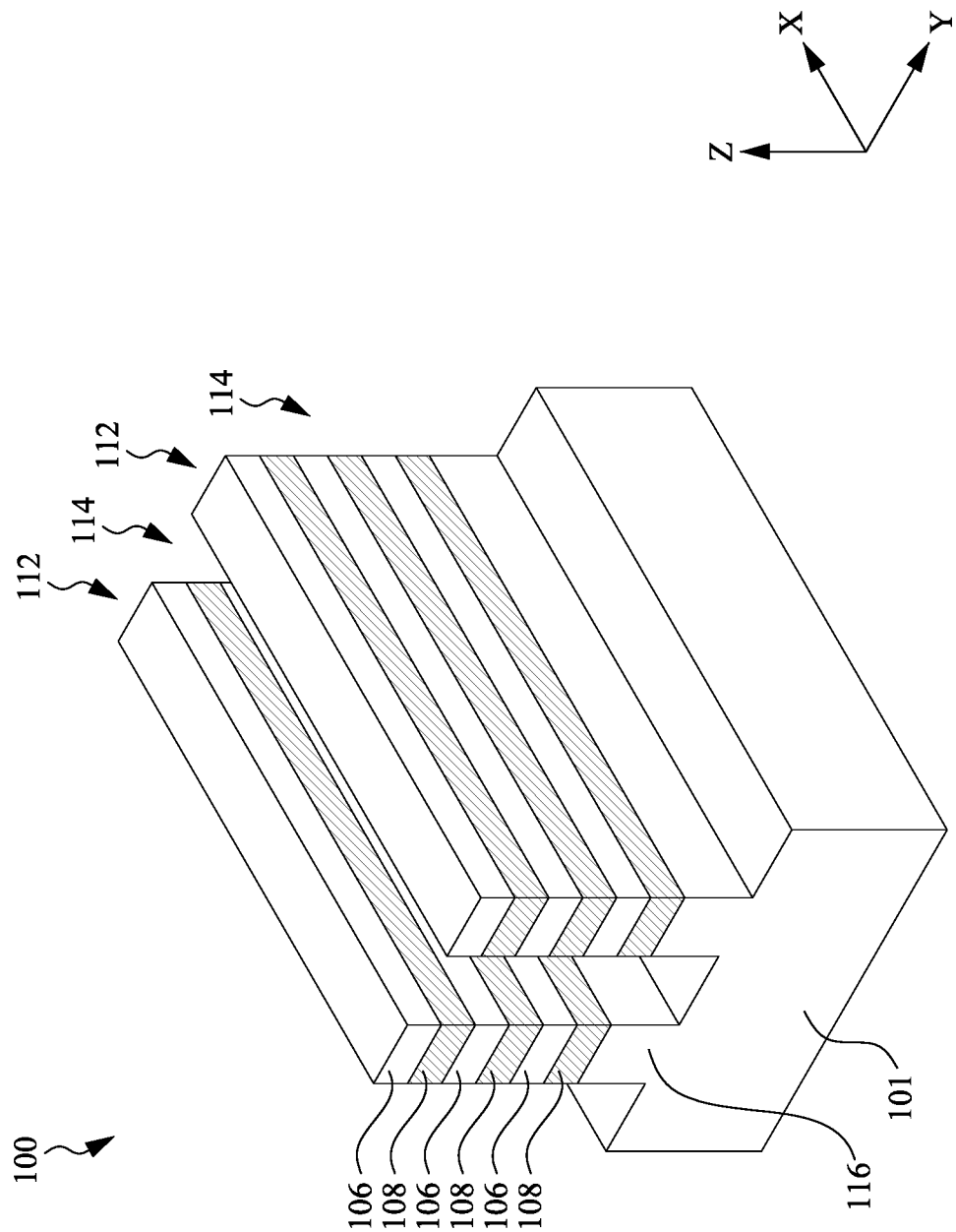

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
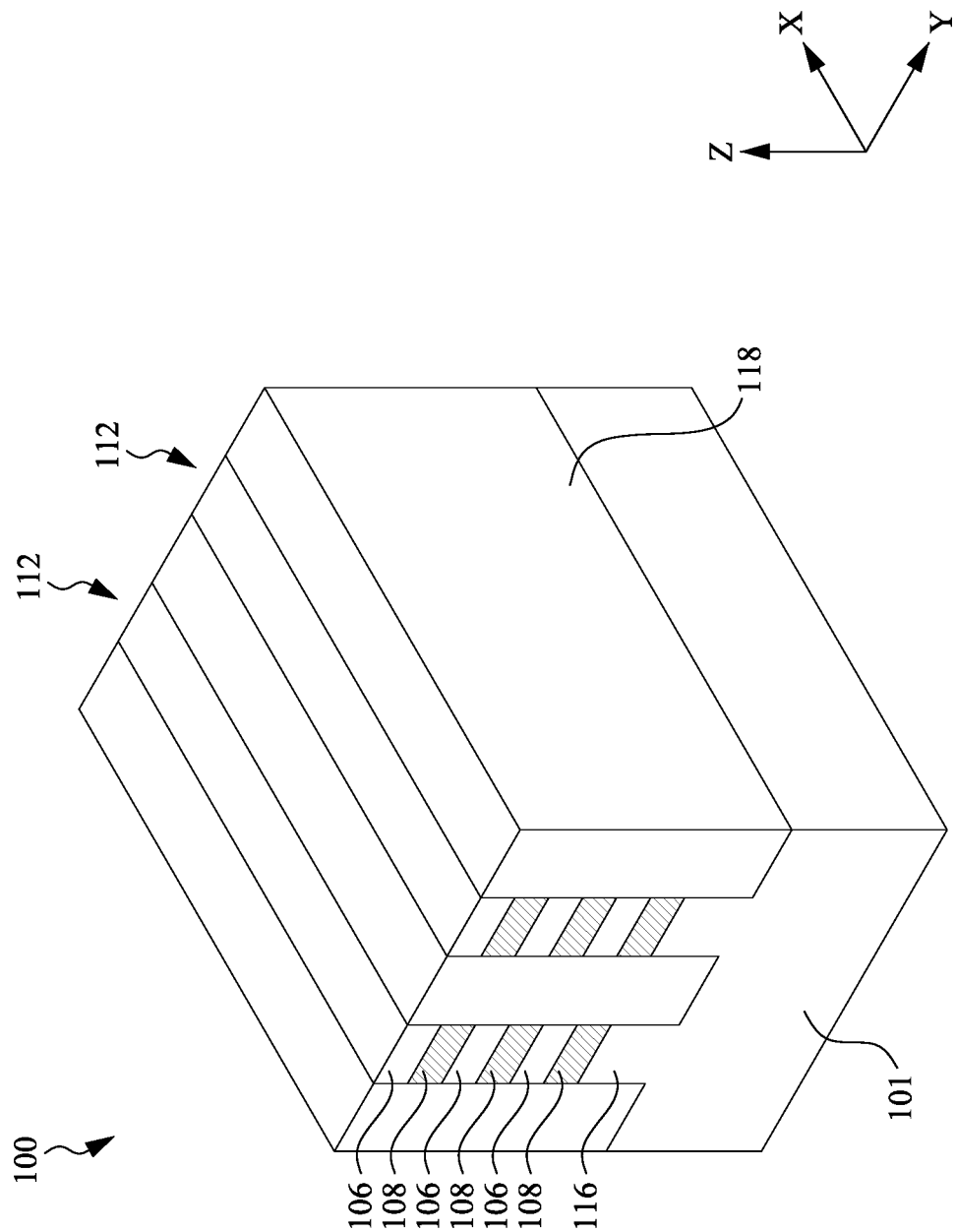

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
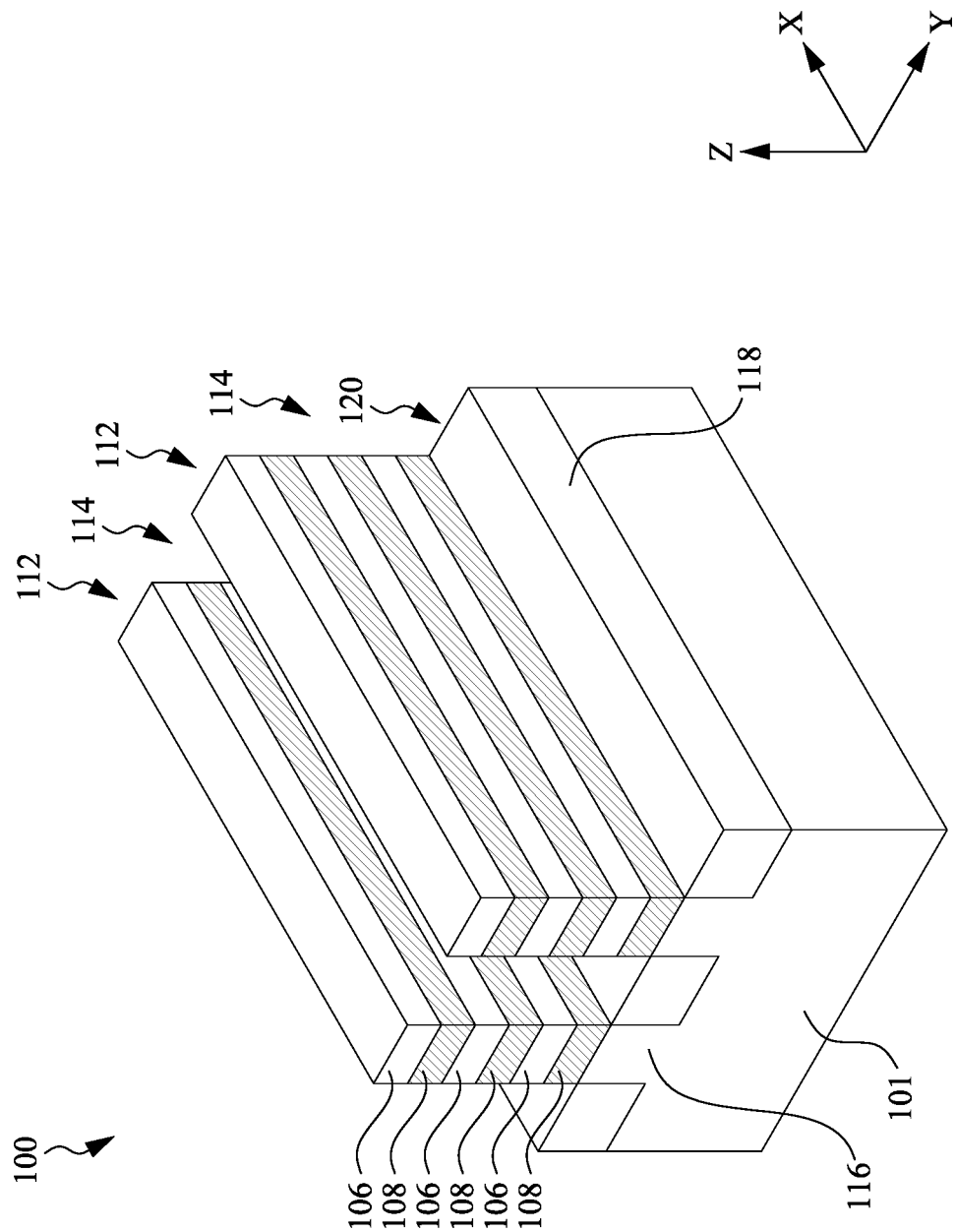

In FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
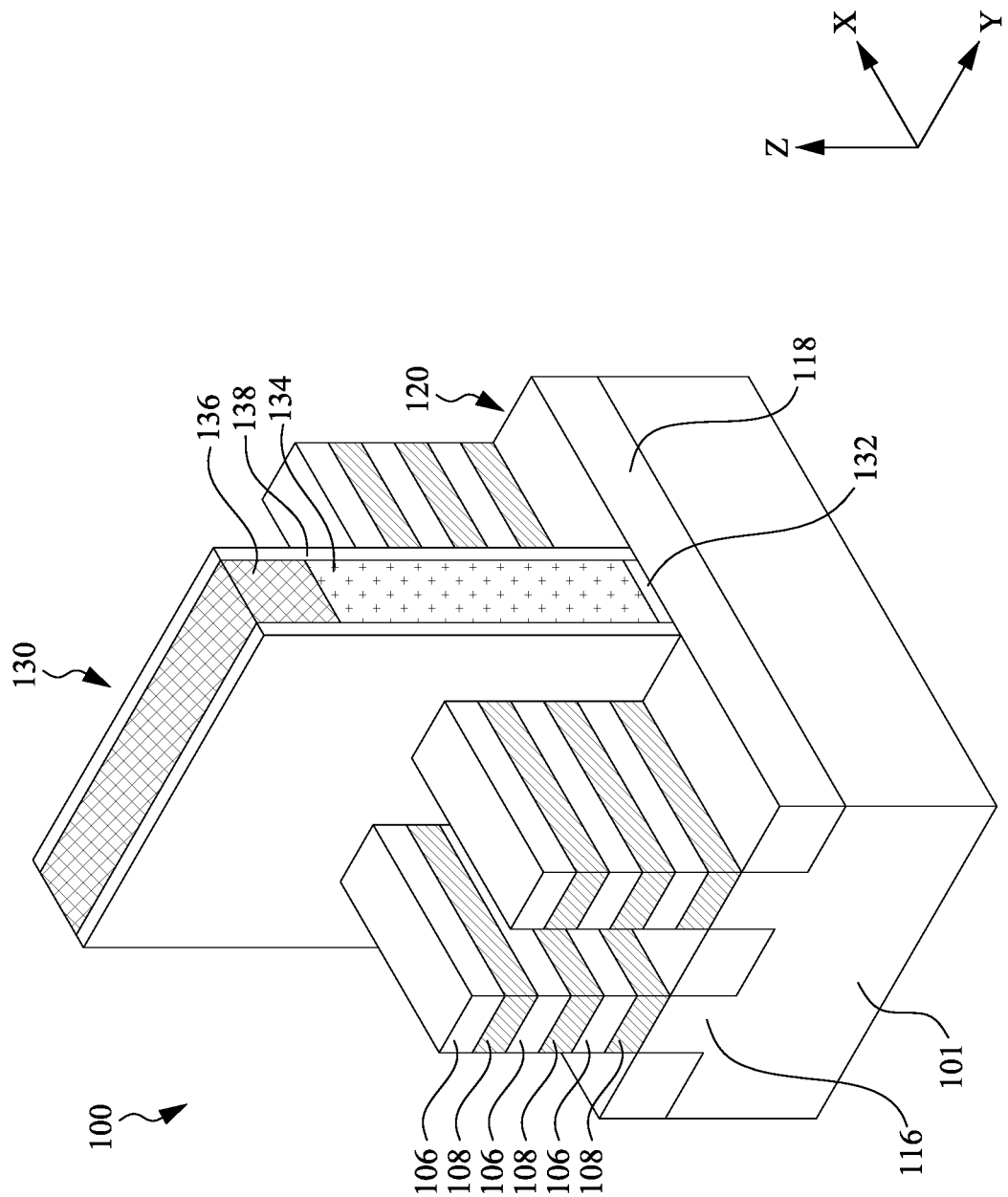

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors. For example, various one of the S/D regions may be connected together and implemented as multiple functional transistors. It should be understood that the source region and the drain region can be interchangeably used since the epitaxial features to be formed in these regions are substantially the same.

Figure 6:
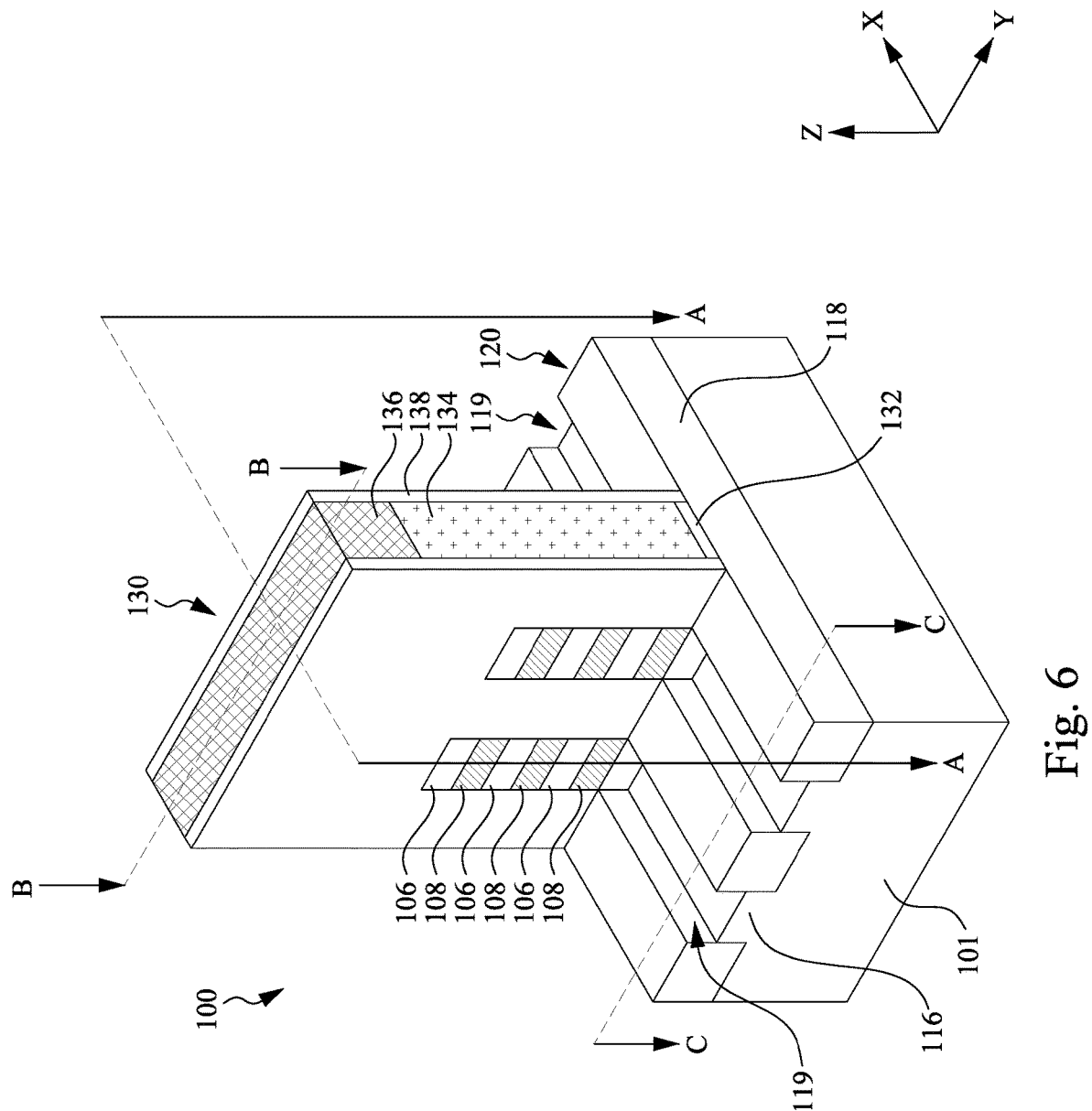

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH$_4$OH), or any suitable etchant. Trenches 119 are formed in the S/D regions as the result of the recess of the portions of the fin structures 112.

FIGS. 7A, 7B, and 7C are cross-sectional side views of the semiconductor device structure 100 taken along line A-A, line B-B, and line C-C of FIG. 6, respectively.

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing edge portions of each second semiconductor layers 108, a dielectric layer (or so-called inner spacer) is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, epitaxial S/D features 146 are formed in the source/drain (S/D) regions. The epitaxial S/D features 146 may be made of one or more layers of Si, SiP, SiC and SiCP for n-channel FETs or Si, SiGe, Ge for p-channel FETs. For p-channel FETs, p-type dopants, such as boron (B), may also be included in the epitaxial S/D features 146. The epitaxial S/D features 146 may be formed by an epitaxial growth method using CVD, ALD or MBE.

In one example shown in FIG. 9A, one of a pair of epitaxial S/D features 146 disposed on one side of the sacrificial gate structure 130 is designated as a source feature/terminal, and the other of the pair of epitaxial S/D features 146 disposed on the other side of the sacrificial gate structure 130 is designated as a drain feature/terminal. The source feature/terminal and the drain feature/terminal are connected by the channel layers (e.g., the first semiconductor layers 106). The epitaxial S/D features 146 are in contact with the first semiconductor layer 106 under the sacrificial gate structure 130. In some cases, the epitaxial S/D features 146 may grow pass the topmost semiconductor channel, i.e., the first semiconductor layer 106 under the sacrificial gate structure 130, to be in contact with the gate spacers 138. The second semiconductor layer 108 under the sacrificial gate structure 130 are separated from the epitaxial S/D features 146 by the dielectric spacers 144.

The epitaxial S/D features 146 may grow both vertically and horizontally to form facets, which may correspond to crystalline planes of the material used for the substrate 101. In some cases, the epitaxial S/D features 146 of a fin structure may grow and merge with the epitaxial S/D features 146 of the neighboring fin structures, as one example shown in FIG. 9C.

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, the epitaxial S/D features 146, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include compounds comprising Si, O, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 11A:
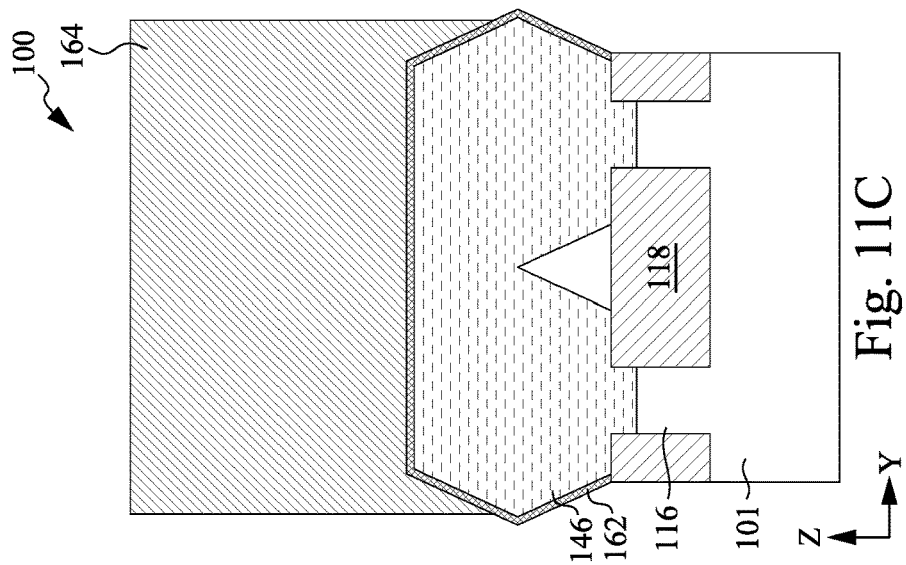
Figure 11B:
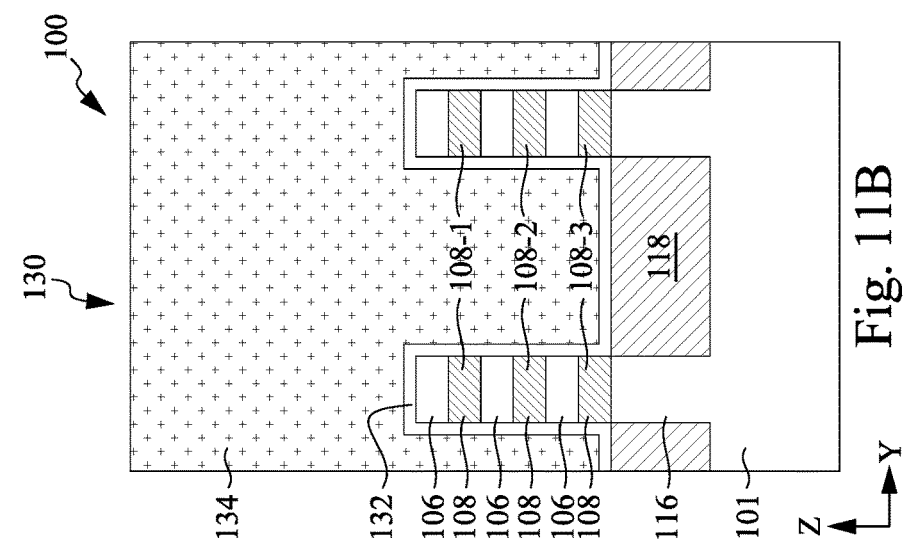
Figure 11C:
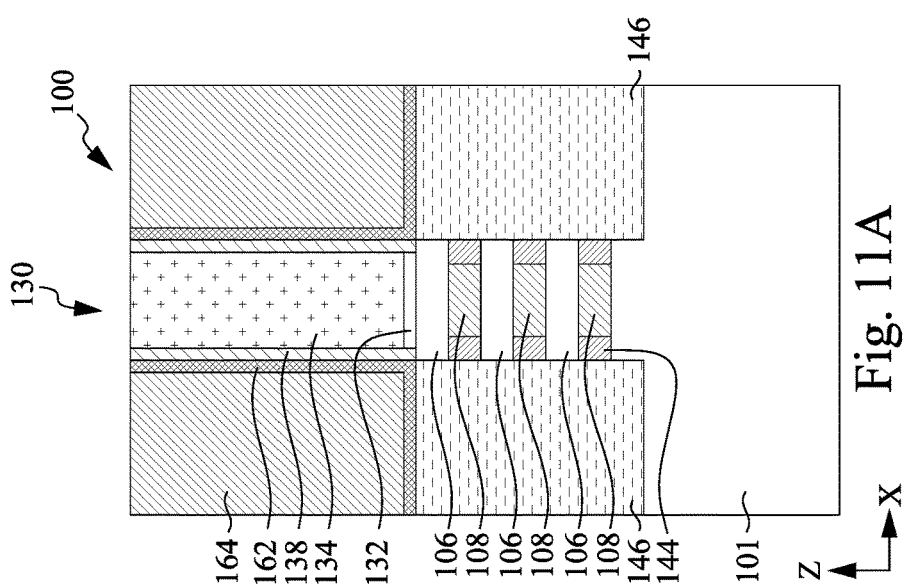

FIGS. 11A, 11B, and 11C are cross-sectional side views of one of various stages of manufacturing the semiconductor device structure 100 taken along line A-A, line B-B, and line C-C of FIG. 6, respectively, in accordance with some embodiments. As shown in FIG. 11A, after the first ILD layer 164 is formed, a planarization operation, such as CMP, is performed on the semiconductor device structure 100 until the sacrificial gate electrode layer 134 is exposed.

FIGS. 12A, 12B, and 12C are cross-sectional side views of one of various stages of manufacturing the semiconductor device structure 100 taken along line A-A, line B-B, and line C-C of FIG. 6, respectively, in accordance with some embodiments. As shown in FIGS. 12A and 12B, the sacrificial gate structure 130 is removed. The first ILD layer 164 protects the epitaxial S/D features 146 during the removal of the sacrificial gate structure 130. The sacrificial gate structure 130 can be removed using plasma dry etching and/or wet etching. For example, in cases where the sacrificial gate electrode layer 134 is polysilicon and the first ILD layer 164 is silicon oxide, a wet etchant such as a tetramethylammonium hydroxide (TMAH) solution can be used to selectively remove the sacrificial gate electrode layer 134 without removing the dielectric materials of the first ILD layer 164, the CESL 162, and the gate spacers 138. The sacrificial gate dielectric layer 132 is thereafter removed using plasma dry etching and/or wet etching. The removal of the sacrificial gate structure 130 (i.e., the sacrificial gate electrode layer 134 and the sacrificial gate dielectric layer 132) forms a trench 166 in the regions where the sacrificial gate electrode layer 134 and the sacrificial gate dielectric layer 132 were removed. The trench 166 exposes the top and sides of the stack of semiconductor layers 104 (e.g., the first semiconductor layers 106 and the second semiconductor layers 108).

FIGS. 13A, 13B, and 13C are cross-sectional side views of one of various stages of manufacturing the semiconductor device structure 100 taken along line A-A, line B-B, and line C-C of FIG. 6, respectively, in accordance with some embodiments. As shown in FIG. 13B, the stack of semiconductor layers 104 (e.g., the first semiconductor layers 106 and the second semiconductor layers 108) is optionally subjected to an ion implantation process to change material properties of the stack of semiconductor layers 104. Particularly, the ion implantation process is controlled (e.g., by adjusting the implant energy and/or implant angle) so that majority of the dopants are implanted into the second semiconductor layers 108. The implanted dopants act as a barrier (or energy barrier) which slows down the chemical reaction of the second semiconductor layers 108 with an etchant at a later stage. Greater energy barrier can be achieved by increasing the implant dosage, which in turn increases the dopant concentration in the implanted regions. As a result, the chemical reaction (e.g., etching reaction) in the implanted regions (e.g., the second semiconductor layers 108) is reduced. As will be discussed in more detail below, one or more second semiconductor layers 108 are laterally recessed to provide additional conductive area for effective control of the nanosheet channels of the semiconductor device structure. The implanted dopants in the second semiconductor layers 108, along with varying Ge percentages (e.g., embodiments A01-A06 discussed previously) in the second semiconductor layers 108, can help control the lateral recess of the second semiconductor layers 108, thereby obtaining various recessed profiles of the second semiconductor layers 108 as shown in FIGS. 14B, 15A-15E, 16A-16F, 19A-19C and 20A-20C.

Exemplary dopants may include, but are not limited to, boron (B), phosphorus (P), germanium (Ge), arsenic (As), selenium (Se), bromine (Br), krypton (Kr), silicon (Si), sulfur (S), chlorine (Cl), argon (Ar), or gallium (Ga), or the like, or any combination thereof. In some embodiments, which can be combined with any of the embodiments discussed in this disclosure, the ion implantation process is performed using kinetic energy in a range between about 1 keV and about 30 keV, and an implant dosage in a range between about $1\times10^{13}$ cm$^{-2}$ and about $1\times10^{15}$ cm$^{-2}$. It is appreciated, however, that the implanted dopant concentration for a given depth profile in the second semiconductor layers 108 (e.g., the second semiconductor layer 108-1, 108-2, 108-3) is a function of the implant dosage. Because the doping is made by ion implantation, the dopant concentration varies with the depth from the exposed surface (e.g., the exposed surface 107 of the topmost first semiconductor layer 106) according to an nearly Gaussian distribution, increasing from the exposed surface of the topmost first semiconductor layer 106 up to a maximum dopant concentration at the projected range of the implantation distribution (e.g., the second semiconductor layer 108-1, 108-2) and then decreasing continuously toward deeper depths into the stack of the semiconductor layer 104.

The ion implantation process may be a vertical implantation process (i.e., ion streams 105 are substantially perpendicular to the exposed surface 107 of the topmost first semiconductor layer 106 to be implanted) or a tilted (angled) implantation process (i.e., ion streams are directed at an angle with respect to the surface of the layer to be implanted). The tilt angle can be in a range between about 0 degree and about 30 degrees. Using the mask (not shown) and a selected angle of the tilted ion implantation process, the ion streams can be directed to a predefined region, such as regions where the second semiconductor layers 108-1, 108-2, 108-3 are located. In any case, the dopant concentration in the second semiconductor layers 108 may be about $1\times10^{17}$/cm$^3$ and about $1\times10^{20}$/cm$^3$.

In some embodiments, which can be combined with any embodiment(s) discussed in this disclosure, the ion implantation process is controlled so that the dopant concentration at the upper region of the stack of the semiconductor layers 104 (e.g., first semiconductor layer 106 and the second semiconductor layer 108-1) is greater than the dopant concentration at the middle region of the stack of the semiconductor layers 104 (e.g., the second semiconductor layer 108-2 and the first semiconductor layer 106 between the second semiconductor layer 108-1 and the second semiconductor layer 108-2) and/or the lower region of the stack of the semiconductor layers 104 (e.g., the second semiconductor layer 108-3 and the first semiconductor layer 106 between the second semiconductor layer 108-2 and the second semiconductor layer 108-3). With this ion implantation scheme, the second semiconductor layers 108-2 and 108-3 can be etched at a rate faster than the second semiconductor layer 108-1.

In some embodiments, which can be combined with any embodiment(s) discussed in this disclosure, the ion implantation process is controlled so that the dopant concentration at the middle region of the stack of the semiconductor layers 104 (e.g., the second semiconductor layer 108-2 and the first semiconductor layer 106 between the second semiconductor layer 108-1 and the second semiconductor layer 108-2) is greater than the dopant concentration at the upper region of the stack of the semiconductor layers 104 (e.g., first semiconductor layer 106 and the second semiconductor layer 108-1) and/or the lower region of the stack of the semiconductor layers 104 (e.g., the second semiconductor layer 108-3 and the first semiconductor layer 106 between the second semiconductor layer 108-2 and the second semiconductor layer 108-3). With this ion implantation scheme, the second semiconductor layers 108-1 and 108-3 can be etched at a rate faster than the second semiconductor layers 108-2.

In some embodiments, which can be combined with any embodiment(s) discussed in this disclosure, the ion implantation process is controlled so that the second semiconductor layer 108 at the upper region of the stack of the semiconductor layers 104 (e.g., the second semiconductor layer 108-1) has a first dopant concentration, and the second semiconductor layer 108 at the middle region of the stack of the semiconductor layers 104 (e.g., the second semiconductor layer 108-2) has a second dopant concentration that is similar or identical to the first dopant concentration. The second semiconductor layer 108 at the lower region of the stack of the semiconductor layers 104 (e.g., the second semiconductor layer 108-3) may have a third dopant concentration that is less than the first dopant concentration and second dopant concentration. With this ion implantation scheme, the second semiconductor layers 108-1 and 108-2 can be etched at a rate faster than the second semiconductor layers 108-3.

In one exemplary aspect, the second semiconductor layer 108 at the upper region of the stack of the semiconductor layers 104 (e.g., the second semiconductor layer 108-1) has a first dopant concentration, and the second semiconductor layer 108 at the middle region of the stack of the semiconductor layers 104 (e.g., the second semiconductor layer 108-2) has a second dopant concentration that is similar or identical to the first dopant concentration. The second semiconductor layer 108 at the lower region of the stack of the semiconductor layers 104 (e.g., the second semiconductor layer 108-3) may have a third dopant concentration that is greater than the first dopant concentration and second dopant concentration. With this ion implantation scheme, the second semiconductor layer 108-3 can be etched at a rate faster than the second semiconductor layers 108-1 and 108-2.

In various embodiments, a thermal annealing process, such as a rapid thermal annealing (RTA) process, can be performed after the ion implantation process to activate the implanted dopant atoms. The thermal annealing process may be performed for about 20 seconds to about 60 seconds and heats the semiconductor device structure 100 to a target temperature of about 850° C. to about 1150° C.

FIGS. 14A, 14B, and 14C are cross-sectional side views of one of various stages of manufacturing the semiconductor device structure 100 taken along line A-A, line B-B, and line C-C of FIG. 6, respectively, in accordance with some embodiments. As shown in FIG. 14B, portions of the exposed second semiconductor layers 108 are removed along the Y direction. The removal of the portions of the exposed second semiconductor layers 108 may be performed by any suitable removal process. In cases where the second semiconductor layers 108 were formed according to the embodiment A01 discussed above with respect to FIG. 1 (i.e., each second semiconductor layer 108-1, 108-2, 108-3 has similar or identical Ge atomic percentage), the removal process can result in recessed second semiconductor layers 108a, 108b, 108c and the dielectric spacers 144 between the first semiconductor layers 106, and each of the recessed second semiconductor layers 108a, 108b, 108c has a similar width and height due to the same Ge atomic percentage selectively chosen for the second semiconductor layers 108-1, 108-2, 108-3. In such cases, the height of each of the recessed second semiconductor layer 108a, 108b, 108c is greater than the width of each of the recessed second semiconductor layer 108a, 108b, 108c. The resulting first semiconductor layers 106 and the recessed second semiconductor layers 108a, 108b, 108c are therefore T-shaped stacked nanosheet device. That is, at least a pair of the first semiconductor layer 106 and the second semiconductor layer 108 (e.g., the second semiconductor layer 108a) in contact with the first semiconductor layer 106 form a T-shaped profile when viewed in Z-Y plane.

FIG. 14D shows an enlarged view of a portion of first and second semiconductor layers 106, 108 shown in FIG. 14B. As can be seen in FIG. 14D, the first semiconductor layer 106 has a width "W1" and the second semiconductor layer 108a in contact with the first semiconductor layer 106 has a width "W2" that is less than the width "W1", thereby form a T-shaped profile. The second semiconductor layer 108a also has a height "H1" that is greater than the width "W2". Depending on the application, the width "W1" may be in a range of about 40 nm to about 60 nm, the height "H1" may be in a range of about 5 nm to about 15 nm, and the width "W2" may be in a range of about 1 nm to about 10 nm, such as about 3 nm to about 6 nm. The ratio of the height "H1" to width "W2" may be about 1.5:1 or greater, such as about 5:1 or greater, for example about 15:1 or greater.

The exposed surfaces of the recessed second semiconductor layers 108a, 108b, 108c and the exposed surfaces of the first semiconductor layers 106 that were covered but then revealed as the result of the removal of the portions of the second semiconductor layers 108 (hereinafter revealed surfaces 106a, 106b) are considered as channel layers, which are to be covered by a gate dielectric layer and a gate electrode layer (FIG. 17B) during subsequent gate replacement process, and thus, serve as current conduct regions. Compared to the conventional gate-all-around (GAA) nanowire transistors in which exposed nanosheet channels (comparable to first semiconductor layers 106 in FIG. 14B) are completely surrounded by the gate dielectric layer and the gate electrode layer without the presence of a semiconductor layer (comparable to second semiconductor layers 108 in FIG. 14B) between the exposed nanosheet channels, the recessed second semiconductor layers 108a, 108b, 108c and the exposed surfaces of the first semiconductor layers 106 (e.g., revealed surfaces 106a, 106b) can provide additional conductive area for effective control of drive current in the nanowire transistors of the semiconductor device structure. Therefore, if the ratio of the height "H1" to width "W2" is less than 1.5:1, the effective current conduct regions may be decreased due to the reduction of the revealed surfaces 106a, 106 (meaning the revealed surfaces 106a, 106b are covered by recessed second semiconductor layers 108a having a wider width). When the ratio of the height "H1" to width "W2" increases, the effective current conduct regions increase accordingly. If the ratio of the height "H1" to width "W2" is greater than 15:1, the manufacturing cost is increased without significant advantage. Depending on the application, the height "H1" can be increased to provide effective current conduct regions for the nanowire transistors. If desired, any one or more recessed second semiconductor layers 108a, 108b, 108c may have a height that is different from the height of the rest of the recessed second semiconductor layers 108a, 108b, 108c.

Portions of the second semiconductor layers 108 may be removed using a selective wet etching process. In cases where the second semiconductor layers 108 are made of SiGe or Ge and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, hydrofluoric (HF), nitric acid (HNO$_3$), hydrochloric acid (HCl), phosphoric acid (H$_3$PO$_4$), a dry etchant such as fluorine-based (e.g., F$_2$) or chlorine-based gas (e.g., Cl$_2$), or any suitable isotropic etchants.

In some embodiments, the selective wet etching process may be a two-step etch process so that the second semiconductor layers 108 are gradually etched to ensure the second semiconductor layers 108a, 108b, 108c are formed with uniform width. For example, a first etch process can be performed to obtain the second semiconductor layers 108 having a width "W3" (represented by a dashed line), followed by a second etch process to further reduce the width from "W3" to "W2". The width "W3" may be in a range between about 10 nm and about 20 nm, and the width "W2" may be in a range between about 1 nm and about 10 nm. The first etch process may be performed for a first time period "T1", and the second etch process may be performed for a second time period "T2" that is shorter than the first time period "T1". The first etch process and the second etch process may use the same or different etchant.

While the recessed second semiconductor layers 108a, 108b, 108c are shown as having the same width, it is contemplated that one or more recessed second semiconductor layers 108a, 108b, 108c may be etched to have a different width than the width of the rest of the recessed second semiconductor layers, such as embodiments shown in FIGS. 19B and 20B. This can be achieved by controlling the Ge atomic percentage of any of the second semiconductor layers 108, implanting dopants into any of the second semiconductor layers 108, or the combination of both.

FIGS. 15A-15E are cross-sectional side views of the semiconductor device structure 100 taken along line B-B of FIG. 6, showing various embodiments of the second semiconductor layer 108 after the removal process, such as the selective wet etching process used to form recessed second semiconductor layers 108a, 108b, 108c in FIG. 14B. Embodiments of FIGS. 15A-15E are substantially identical to the embodiment shown in FIG. 14B except that the second semiconductor layers 108 were formed with different Ge concentrations as discussed above with respect to embodiments A02-A06.

FIG. 15A illustrates an embodiment where second semiconductor layers 108 were formed according to the embodiment A02 discussed in FIG. 1 above (i.e., second semiconductor layer 108-1, 108-2 has similar or identical Ge atomic percentage, and second semiconductor layer 108-3 has a Ge atomic percentage greater than that of second semiconductor layer 108-1, 108-2). Since the second semiconductor layers 108 having higher Ge atomic percentages are etched faster than the second semiconductor layers 108 having lower Ge atomic percentages, the second semiconductor layers 108-3 are fully removed before the second semiconductor layers 108-1, 108-2 do. Therefore, the removal process can result in recessed second semiconductor layers 108a, 108b and the dielectric spacers 144 between the first semiconductor layers 106, and the second semiconductor layer 108-3 between the first semiconductor layer 106 (e.g., first semiconductor layer 106c) and the well portion 116 is completely etched away as the result of the removal process. The ion implantation process discussed previously can be performed to selectively control the etch rates of the second semiconductor layer 108-3 being faster than that of second semiconductor layers 108-1, 108-2.

Likewise, each of the recessed second semiconductor layers 108a, 108b has a similar width and height due to the same Ge atomic percentage selectively chosen for the second semiconductor layers 108a, 108b, and the height of each of the recessed second semiconductor layer 108a, 108b is greater than the width of each of the recessed second semiconductor layer 108a, 108b. After the removal process, at least a pair of the first semiconductor layer 106 (e.g., first semiconductor layer 106a) and the second semiconductor layer 108 (e.g., the second semiconductor layer 108a) in contact with the first semiconductor layer 106a form a T-shaped profile when viewed in Z-Y plane.

FIG. 15B illustrates an embodiment where second semiconductor layers 108 were formed according to the embodiment A03 discussed in FIG. 1 above (i.e., second semiconductor layer 108-2, 108-3 has similar or identical Ge atomic percentage, and second semiconductor layer 108-1 has a Ge atomic percentage less than that of second semiconductor layer 108-2, 108-3). Due to higher Ge atomic percentages of the second semiconductor layers 108-2 and 108-3, the second semiconductor layers 108-2, 108-3 are removed faster than the second semiconductor layer 108-1. Therefore, the removal process can result in the dielectric spacers 144 and recessed second semiconductor layer 108a between the first semiconductor layer 106, and the second semiconductor layers 108-2 and 108-3 are completely etched away as the result of the removal process. The ion implantation process discussed previously can be performed to selectively control the etch rates of the second semiconductor layers 108-2 and 108-3 being faster than that of second semiconductor layer 108-1.

Likewise, the height of the recessed second semiconductor layer 108a is greater than its width. After the removal process, at least a pair of the first semiconductor layer 106 (e.g., first semiconductor layer 106a) and the second semiconductor layer 108a in contact with the first semiconductor layer 106a form a T-shaped profile when viewed in Z-Y plane.

FIG. 15C illustrates an embodiment where second semiconductor layers 108 were formed according to the embodiment A04 discussed in FIG. 1 above (i.e., second semiconductor layer 108-1, 108-3 has similar or identical Ge atomic percentage, and second semiconductor layer 108-2 has a Ge atomic percentage greater than that of second semiconductor layer 108-1, 108-3). Due to higher Ge atomic percentages of the second semiconductor layers 108-1 and 108-3, the second semiconductor layers 108-1, 108-3 are removed faster than the second semiconductor layer 108-2. Therefore, the removal process can result in the dielectric spacers 144 and recessed second semiconductor layer 108b between the first semiconductor layer 106, and the second semiconductor layers 108-1 and 108-3 are completely etched away as the result of the removal process. The ion implantation process discussed previously can be performed to selectively control the etch rates of the second semiconductor layers 108-1 and 108-3 being faster than that of second semiconductor layer 108-2.

Likewise, the height of the recessed second semiconductor layer 108b is greater than its width. After the removal process, at least a pair of the first semiconductor layer 106 (e.g., first semiconductor layer 106b) and the second semiconductor layer 108b in contact with the first semiconductor layer 106b form a T-shaped profile when viewed in Z-Y plane.

Figure 15E:
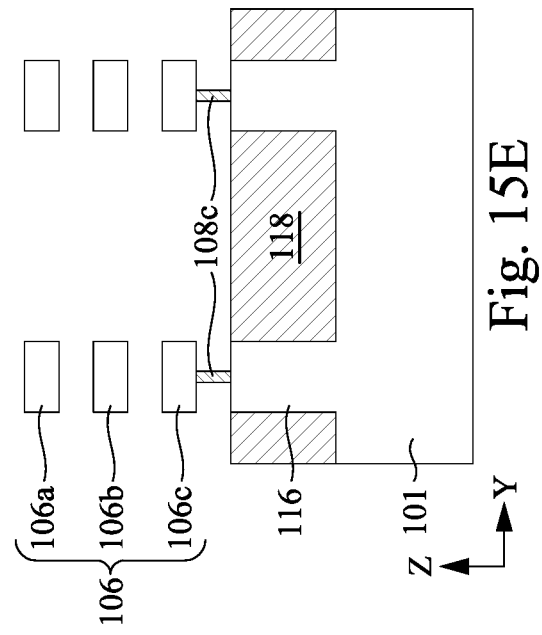
Figure 15D:
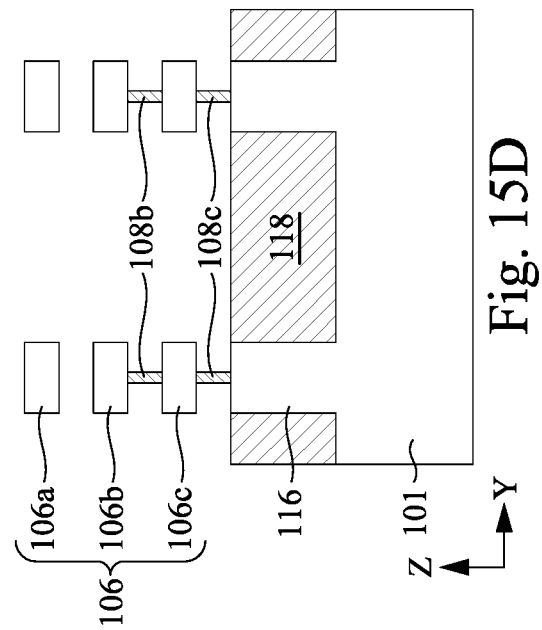

FIG. 15D illustrates an embodiment where second semiconductor layers 108 were formed according to the embodiment A05 discussed in FIG. 1 above (i.e., second semiconductor layer 108-2, 108-3 has similar or identical Ge atomic percentage, and second semiconductor layer 108-1 has a Ge atomic percentage greater than that of second semiconductor layer 108-2, 108-3). Due to higher Ge atomic percentages of the second semiconductor layers 108-1, the second semiconductor layer 108-1 is removed faster than the second semiconductor layers 108-2, 108-3. Therefore, the removal process can result in the dielectric spacers 144 and recessed second semiconductor layers 108b, 108c between the first semiconductor layer 106 (e.g., first semiconductor layer 106b) and the well portion 116, and the second semiconductor layer 108-1 is completely etched away as the result of the removal process. The ion implantation process discussed previously can be performed to selectively control the etch rates of the second semiconductor layer 108-1 being faster than that of second semiconductor layers 108-2, 108-3.

Likewise, the height of each of the recessed second semiconductor layers 108b, 108c is greater than its width. After the removal process, at least a pair of the first semiconductor layer 106 (e.g., first semiconductor layer 106c) and the second semiconductor layer 108 (e.g., second semiconductor layer 108b or 108c) in contact with the first semiconductor layer 106c form a T-shaped profile when viewed in Z-Y plane.

FIG. 15E illustrates an embodiment where second semiconductor layers 108 were formed according to the embodiment A06 discussed in FIG. 1 above (i.e., second semiconductor layer 108-1, 108-2 has similar or identical Ge atomic percentage, and second semiconductor layer 108-3 has a Ge atomic percentage greater than that of second semiconductor layer 108-1, 108-2). Due to higher Ge atomic percentages of the second semiconductor layer 108-3, the second semiconductor layers 108-1, 108-2 are removed faster than the second semiconductor layer 108-3. Therefore, the removal process can result in the dielectric spacers 144 and recessed second semiconductor layer 108c between the first semiconductor layer 106, and the second semiconductor layers 108-1 and 108-2 are completely etched away as the result of the removal process. The ion implantation process discussed previously can be performed to selectively control the etch rates of the second semiconductor layers 108-1 and 108-2 being faster than that of second semiconductor layer 108-3.

Likewise, the height of the recessed second semiconductor layer 108c is greater than its width. After the removal process, at least a pair of the first semiconductor layer 106 (e.g., first semiconductor layer 106c) and the second semiconductor layer 108c in contact with the first semiconductor layer 106c form a T-shaped profile when viewed in Z-Y plane.

FIGS. 16A-16F are cross-sectional side views of the semiconductor device structure 100 taken along line B-B of FIG. 6, showing various embodiments of the second semiconductor layer 108 after a removal process. Embodiments of FIGS. 16A-16F are substantially identical to the embodiment shown in FIGS. 14B and 15A-15E in terms of the material except that the second semiconductor layers 108 are etched using an anisotropic etching process, instead of the isotropic etchants used in FIGS. 14B and 15A-15E. Particularly, the second semiconductor layers 108 in the embodiments of FIGS. 16A-16F are etched to have tapered shape or portion on opposing ends of the recessed second semiconductor layers. Depending on which crystal plane of the second semiconductor layers 108 is exposed, the chemical reaction rates can be different on different crystal planes. For example, alkaline aqueous based etchants, such as potassium hydroxide (KOH), may be used to etch crystalline of the second semiconductor layers 108 such that the reaction rate on {100} crystal planes is faster than the {111} crystal planes. The tapered shape or portion is formed on opposing ends of the recessed second semiconductor layers 108 as the result of such orientation-dependent etching. In various embodiments, the second semiconductor layers 108 can be removed using a wet etchant such as, but not limited to, ammonium hydroxide (NH₄OH), tetramethylammonium hydroxide (TMAH), ethylenediamine pyrocatechol (EDP), potassium hydroxide (KOH) solution, or sodium hydroxide (NaOH).

FIG. 16A illustrates an embodiment where the second semiconductor layers 108 were formed according to the embodiment A01 as discussed in FIG. 1 above. Like the embodiment shown in FIG. 14B, the removal process can result in recessed second semiconductor layers 108e, 108f, 108g and the dielectric spacers 144 (FIG. 14A) between the first semiconductor layers 106, and each of the recessed second semiconductor layers 108e, 108f, 108g has a similar width and height due to the same Ge atomic percentage selectively chosen for the second semiconductor layers 108-1, 108-2, 108-3 (FIG. 13B). Therefore, at least a pair of the first semiconductor layer 106 (e.g., first semiconductor layer 106a) and the second semiconductor layer 108 (e.g., the second semiconductor layer 108e) in contact with the first semiconductor layer 106a form a T-shaped profile when viewed in Z-Y plane, with tapered shape or portion formed on both opposing ends of the recessed second semiconductor layer 108e.

FIG. 16G is an enlarged view of a portion of first and second semiconductor layers 106, 108 shown in FIG. 16A. As can be seen in FIG. 16G, the recessed second semiconductor layers 108 (e.g., second semiconductor layer 108e) has a first portion 108e-1 in contact with the first semiconductor layer 106 (e.g., first semiconductor layer 106a), a second portion 108e-2 opposing the first portion 108e-1 and in contact with the first semiconductor layer 106 (e.g., first semiconductor layer 106b), and a third portion 108e-3 connecting the first portion 108e-1 to the second portion 108e-2. The third portion 108e-3 has a width "W4", and the first and second portions 108e-1, 108e-2 each has a width gradually increasing from the width "W4" to width "W5". The width "W5" is smaller than the width "W6" of the first semiconductor layers 106 (e.g., first semiconductor layer 106a). The recessed second semiconductor layer 108e also has a height "H2" that is greater than the width "W4" or "W5". In some embodiments, the width "W2" may be in a range of about 1 nm to about 10 nm, such as about 3 nm to about 6 nm. The ratio of the height "H2" to width "W5" may be about 1.5:1 or greater, such as about 2:1 or greater, for example about 3:1 to about 6:1. The same ratio and widths hold for the recessed second semiconductor layers shown in FIGS. 16B-16F and embodiments shown in FIGS. 20A-20C.

FIG. 16B illustrates an embodiment where the second semiconductor layers 108 were formed according to the embodiment A02 as discussed in FIG. 1 above. Like the embodiment shown in FIG. 15A, the removal process can result in recessed second semiconductor layers 108e, 108f and the dielectric spacers 144 (FIG. 14A) between the first semiconductor layers 106, and the second semiconductor layer 108-3 (FIG. 13B) between the first semiconductor layer 106 (e.g., first semiconductor layer 106c) and the well portion 116 is completely etched away as the result of the removal process. After the removal process, at least a pair of the first semiconductor layer 106 (e.g., first semiconductor layer 106a) and the second semiconductor layer 108 (e.g., the second semiconductor layer 108e) in contact with the first semiconductor layer 106a form a T-shaped profile when viewed in Z-Y plane.

FIG. 16C illustrates an embodiment where the second semiconductor layers 108 were formed according to the embodiment A03 as discussed in FIG. 1 above. Like the embodiment shown in FIG. 15B, the removal process can result in the dielectric spacers 144 (FIG. 14A) and recessed second semiconductor layer 108e between the first semiconductor layers 106 (e.g., first semiconductor layer 106a and 106b), and the second semiconductor layers 108-2 and 108-3 (FIG. 13B) are completely etched away as the result of the removal process. After the removal process, at least a pair of the first semiconductor layer 106 (e.g., first semiconductor layer 106a) and the second semiconductor layer 108e in contact with the first semiconductor layer 106a form a T-shaped profile when viewed in Z-Y plane.

FIG. 16D illustrates an embodiment where the second semiconductor layers 108 were formed according to the embodiment A04 as discussed in FIG. 1 above. Like the embodiment shown in FIG. 15C, the removal process can result in the dielectric spacers 144 (FIG. 14A) and recessed second semiconductor layer 108f between the first semiconductor layer 106 (e.g., first semiconductor layer 106b and 106c), and the second semiconductor layers 108-1 and 108-3 (FIG. 13B) are completely etched away as the result of the removal process. After the removal process, at least a pair of the first semiconductor layer 106 (e.g., first semiconductor layer 106b) and the second semiconductor layer 108f in contact with the first semiconductor layer 106b form a T-shaped profile when viewed in Z-Y plane.

FIG. 16E illustrates an embodiment where the second semiconductor layers 108 were formed according to the embodiment A05 as discussed in FIG. 1 above. Like the embodiment shown in FIG. 15D, the removal process can result in the dielectric spacers 144 (FIG. 14A) and recessed second semiconductor layers 108f, 108g between the first semiconductor layer 106 (e.g., first semiconductor layer 106b) and the well portion 116, and the second semiconductor layer 108-1 (FIG. 13) is completely etched away as the result of the removal process. After the removal process, at least a pair of the first semiconductor layer 106 (e.g., first semiconductor layer 106c) and the second semiconductor layer 108 (e.g., second semiconductor layer 108f or 108g) in contact with the first semiconductor layer 106c form a T-shaped profile when viewed in Z-Y plane.

FIG. 16F illustrates an embodiment where the second semiconductor layers 108 were formed according to the embodiment A06 as discussed in FIG. 1 above. Like the embodiment shown in FIG. 15E, the removal process can result in the dielectric spacers 144 and recessed second semiconductor layer 108g between the first semiconductor layer 106 (e.g., first semiconductor layer 106b) and the well portion 116, and the second semiconductor layers 108-1 and 108-2 (FIG. 13) are completely etched away as the result of the removal process. After the removal process, at least a pair of the first semiconductor layer 106 (e.g., first semiconductor layer 106c) and the second semiconductor layer 108g in contact with the first semiconductor layer 106c form a T-shaped profile when viewed in Z-Y plane.

It is contemplated that the ion implantation process discussed previously can be performed to selectively control the etch rates of the second semiconductor layers in various embodiments of the present disclosure, such as FIGS. 16A-16F, 19A-19C, and 20A-20C.

After the formation of the nanosheet channels (i.e., the exposed first semiconductor layers 106 and recessed second semiconductor layers 108a, 108b, 108c), a gate dielectric layer 170 is formed on the first semiconductor layers 106 and the recessed second semiconductor layers 108a, 108b, 108c, and a gate electrode layer 172 is formed on the gate dielectric layer 170, as shown in FIGS. 17A and 17B. FIG.

17B is based on the embodiment of FIG. 14B. The gate dielectric layer 170 and the gate electrode layer 172 may be collectively referred to as a gate structure 174. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. In one embodiment, the gate dielectric layer 170 is formed using a conformal deposition process such as ALD in order to ensure the formation of a gate dielectric layer having a uniform thickness on the first semiconductor layers 106 and the recessed second semiconductor layers 108a, 108b, 108c.

The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the first ILD layer 164. The gate dielectric layer 170 and the gate electrode layer 172 formed over the first ILD layer 164 are then removed by using, for example, CMP, until the top surface of the first ILD layer 164 is exposed.

FIG. 17D is an enlarged view of a portion of first and second semiconductor layers 106, 108 shown in FIG. 17B. As can be seen in FIG. 17D, the gate dielectric layer 170 is conformally formed on the exposed surfaces of the first semiconductor layers 106 and the recessed second semiconductor layers 108a, 108b, 108c, and the gate electrode layer 172 is formed on and wrapped around the gate dielectric layer 170. The gate dielectric layer 170 may have a thickness "T1" of about 1 nm to about 2 nm. The spacing "D1" between the first semiconductor layers 106 may be in a range of about 5 nm to about 15 nm. The spacing "D1" is measured from the bottom surface 160a-1 of the first semiconductor layer 106a to the top surface 106b-1 of the first semiconductor layer 106b. If the thickness "T1" is less than 1 nm, the gate dielectric layer 170 may suffer from dielectric breakdown and unwanted leakage. On the other hand, if the thickness "T1" of the gate dielectric layer 170 is greater than 2 nm, the gate dielectric layer 170 on the bottom surface 160a-1 of the first semiconductor layer 106a and the gate dielectric layer 170 on the top surface 106b-1 of the first semiconductor layer 106b may merge, which prevents the gate electrode layer 172 from surrounding the recessed second semiconductor layers 108a, 108b, 108c. It should be understood that the spacing "D1" and the thickness "T1" discussed here apply to various embodiments of this disclosure, such as embodiments shown in FIGS. 19A-19C and 20A-20C.

FIGS. 18A, 18B, and 18C are cross-sectional side views of one of various stages of manufacturing the semiconductor device structure 100 taken along line A-A, line B-B, and line C-C of FIG. 6, respectively, in accordance with some embodiments. In FIGS. 18A and 18C, source/drain (S/D) contacts 176 are formed in the first ILD layer 164. Prior to forming the S/D contacts 176, contact openings are formed in the first ILD layer 164 to expose the epitaxial S/D features 146. Suitable photolithographic and etching techniques are used to form the contact openings through various layers, including the first ILD layer 164 and the CESL 162 to expose the epitaxial S/D features 146. In some embodiments, the upper portions of the epitaxial S/D features 146 are etched.

After the formation of the contact openings, a silicide layer 178 is formed on the epitaxial S/D features 146. The silicide layer 178 conductively couples the epitaxial S/D features 146 to the subsequently formed S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 178. Unreacted portion of the metal source layer is then removed. For n-channel FETs, the silicide layer 178 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 178 may be made of a material including one or more of NiSi, CoSi, MnSi, Wsi, FeSi, RhSi, PdSi, RuSi, PtSi, IrSi, OsSi, or combinations thereof. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the S/D contacts 176. The conductive material may be made of a material including one or more of Ru, Mo, Co, Ni, W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the gate electrode layer 172.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 so that either source or drain of the epitaxial S/D features 146 is connected to a backside power rail (e.g., positive voltage VDD or negative voltage VSS) through the backside contacts.

FIGS. 19A-19C illustrate cross-sectional side views of one of various stages of manufacturing the semiconductor device structure 100 taken along line B-B of FIG. 6 in accordance with some embodiments. Particularly, FIGS. 19A-19C show one of the manufacturing stages after the gate dielectric layer 170 and the gate electrode layer 172 are formed on exposed surfaces of the first semiconductor layers 106 and the recessed second semiconductor layers. The embodiment shown in FIG. 19A is based on the embodiment of FIG. 15A. The embodiment shown in FIG. 19C is based on the embodiment of FIG. 15E. The embodiment shown in FIG. 20A is based on the embodiment of FIG. 16B. The embodiment shown in FIG. 20C is based on the embodiment of FIG. 16F.

The embodiment shown in FIG. 19B is based on the embodiment of FIG. 15A, except that the recessed second semiconductor layer 108c is etched to have a width less than the width of the rest of the recessed second semiconductor layers (e.g., second semiconductor layer 108a or 108b). The embodiment shown in FIG. 20B is based on the embodiment of FIG. 16A, except that the recessed second semiconductor layer 108c is etched to have a width less than the width of the rest of the recessed second semiconductor layers (e.g., second semiconductor layer 108e or 108f).

FIG. 19D is an enlarged view of a portion of first semiconductor layer 106 and recessed second semiconductor layers, e.g., recessed second semiconductor layers 108a, 108b shown in FIG. 19A, or recessed second semiconductor layers 108b, 108c shown in FIG. 19B. As can be seen in FIG. 19D, the recessed second semiconductor layer 108a/108b has a width "W7" greater than the width "W8" of the recessed second semiconductor layer 108b/108c. The ratio of the width "W7" to the width "W8" may be in a range of about 1:1 to about 8:1. Such ratio is also applicable to various embodiments of this disclosure, such as the embodiments shown in FIGS. 15B-15E.

FIG. 20D is an enlarged view of a portion of first semiconductor layer 106 and recessed second semiconductor layers, e.g., recessed second semiconductor layers 108e, 108f shown in FIG. 20A, or recessed second semiconductor layers 108f, 108g shown in FIG. 20B. As can be seen in FIG. 20D, the recessed second semiconductor layer 108e/108f has a width "W9" greater than the width "W10" of the recessed second semiconductor layer 108f/108g. The ratio of the width "W9" to the width "W10" may be in a range of about 1:1 to about 8:1. Such ratio is also applicable to various embodiments of this disclosure, such as the embodiments shown in FIGS. 16B-16G. Additionally or alternatively, any one or more recessed second semiconductor layers 108e, 108f, 108g may have a width less than the width of the rest of the recessed second semiconductor layers 108e, 108f, or 108g, depending on the application.

In some embodiments of FIGS. 19A and 20A, the recessed second semiconductor layer 108b, 108f each may have a first Ge atomic percentage range of about 5 at. % to about 25 at. %, and the recessed second semiconductor layers 108a, 108b, 108e, 108f each may have a second Ge atomic percentage range of about 15 at. % and about 50 at. % that is greater than the first Ge atomic percentage range of the recessed second semiconductor layer 108b, 108f. Likewise, in some embodiments of FIGS. 19B and 20B, the recessed second semiconductor layers 108c, 108g each may have a first Ge atomic percentage range of about 5 at. % to about 25 at. %, and the recessed second semiconductor layers 108a, 108b, 108e, 108f each may have a second Ge atomic percentage range of about 15 at. % and about 50 at. % that is greater than the first Ge atomic percentage range of the recessed second semiconductor layers 108c, 108g.

Embodiments of the present disclosure provide a semiconductor device structure having at least one T-shaped stacked nanosheet transistor. The T-shaped stacked nanosheet transistor includes first semiconductor layers forming horizontal section of the T-shaped structure, and second semiconductor layers forming vertical section of T-shaped structure. The T-shaped stacked nanosheet transistor is covered by a gate dielectric layer and a gate electrode layer. Unlike the conventional gate-all-around (GAA) nanowire transistors in which exposed first semiconductor layer (i.e., nanosheet channels) are completely surrounded by the gate dielectric layer and the gate electrode layer without the presence of the second semiconductor layer between the exposed nanosheet channels, the vertical section of inventive T-shaped structure provides additional conductive area for effective control of the nanosheet channels of the semiconductor device structure. As a result, the drive current can be increased without being limited by the channel width or length when scaling down. Advantages of the present disclosure include tunable T-shaped stacked nanosheet transistor to fine tune threshold voltage for multigate devices by controlling Ge atomic percentage in each second semiconductor layer and/or subjecting the second semiconductor layer to an optional ion implantation process to vary the etch rates with an etchant, which can be easily integrated with the current manufacturing process.

An embodiment is a method for forming semiconductor device structures. The method includes forming a fin structure having a stack of semiconductor layers comprising first semiconductor layers and second semiconductor layers alternatingly arranged, forming a sacrificial gate structure over a portion of the fin structure, removing the first and second semiconductor layers in a source/drain region of the fin structure that is not covered by the sacrificial gate structure, forming an epitaxial source/drain feature in the source/drain region, removing portions of the sacrificial gate structure to expose the first and second semiconductor layers, removing portions of the second semiconductor layers so that at least one second semiconductor layer has a width less than a width of each of the first semiconductor layers, forming a conformal gate dielectric layer on exposed first and second semiconductor layers, and forming a gate electrode layer on the conformal gate dielectric layer.

Another embodiment is method for forming semiconductor device structures. The method includes forming a sacrificial gate structure over a portion of a fin structure having a stack of semiconductor layers, wherein the stack of semiconductor layers comprises silicon-containing layers and germanium-containing layers alternatingly arranged, and at least some germanium-containing layers of the stack of the semiconductor layers have a first germanium atomic percentage, and at least some germanium-containing layers of the stack of the semiconductor layers have a second germanium atomic percentage greater than the first germanium atomic percentage, removing the silicon-containing layers and the germanium-containing layers not covered by the sacrificial gate structure, forming an epitaxial source/drain feature in regions where the silicon-containing layers and the germanium-containing layers were removed, removing portions of the sacrificial gate structure to expose the silicon-containing layers and the germanium-containing layers, selectively removing portions of the germanium-containing layers so that at least one germanium-containing layer remaining between two adjacent silicon-containing layers has a height and the two adjacent silicon-containing layers have a width that is greater than the height, and forming a gate electrode layer over exposed surfaces of the silicon-containing layers and the germanium-containing layers.

A further embodiment is a method for forming a semiconductor device structure. The method includes forming a fin structure having a stack of semiconductor layers comprising first semiconductor layers and second semiconductor layers alternatingly arranged, forming a sacrificial gate structure over a portion of the fin structure, removing the first and second semiconductor layers not covered by the sacrificial gate structure, forming an epitaxial source/drain feature in the source/drain region, removing portions of the sacrificial gate structure to expose the first and second semiconductor layers, and selectively removing portions of the second semiconductor layers so that at least one second semiconductor layer remains between two adjacent first semiconductor layers, and the at least one second semiconductor layer has a height and a width that is less than the height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming a fin structure having a stack of semiconductor layers comprising first semiconductor layers and second semiconductor layers alternatingly arranged;
   forming a sacrificial gate structure over a portion of the fin structure;
   removing the first and second semiconductor layers in a source/drain region of the fin structure that is not covered by the sacrificial gate structure;
   forming an epitaxial source/drain feature in the source/drain region;
   removing portions of the sacrificial gate structure to expose the first and second semiconductor layers;
   removing portions of the second semiconductor layers so that at least one second semiconductor layer has a width less than a width of each of the first semiconductor layers;
   after removing portions of the second semiconductor layers, forming a conformal gate dielectric layer on exposed first and second semiconductor layers in the same process, wherein at least a portion of the conformal gate dielectric layer is disposed between adjacent first semiconductor layers; and
   forming a gate electrode layer on the conformal gate dielectric layer.

2. The method of claim 1, wherein portions of the second semiconductor layers are removed so that a height of each second semiconductor layer is greater than the width of each second semiconductor layer.

3. The method of claim 2, wherein the conformal gate dielectric layer is formed to surround four surfaces of at least one first semiconductor layer.

4. The method of claim 1, wherein portions of the second semiconductor layers are removed so that the width of each second semiconductor layer is less than the width of each of the first semiconductor layers.

5. The method of claim 1, wherein the second semiconductor layers comprise SiGe, and each of the second semiconductor layers has similar or identical germanium atomic percentage.

6. The method of claim 5, wherein each of the second semiconductor layers has an atomic percentage of germanium in a range between about 5 at. % and about 25 at. %.

7. The method of claim 1, further comprising:
   after removing portions of the sacrificial gate structure, implanting dopants into the second semiconductor layers.

8. The method of claim 7, wherein the dopants are implanted so that the second semiconductor layers at an upper region of the stack of the semiconductor layers has a dopant concentration greater than a dopant concentration of the second semiconductor layers at a middle region of the stack of the semiconductor layers.

9. The method of claim 7, wherein the second semiconductor layers at an upper region of the stack of the semiconductor layers has a first width and the second semiconductor layers at a lower region of the stack of the semiconductor layers has a second width less than the first width.

10. A method for forming a semiconductor device structure, comprising:
    forming a sacrificial gate structure over a portion of a fin structure having a stack of semiconductor layers, wherein the stack of semiconductor layers comprises silicon-containing layers and germanium-containing layers alternatingly arranged, and at least some germanium-containing layers of the stack of the semiconductor layers have a first germanium atomic percentage, and at least some germanium-containing layers of the stack of the semiconductor layers have a second germanium atomic percentage greater than the first germanium atomic percentage;
    removing the silicon-containing layers and the germanium-containing layers not covered by the sacrificial gate structure;
    forming an epitaxial source/drain feature in regions where the silicon-containing layers and the germanium-containing layers were removed;
    removing portions of the sacrificial gate structure to expose the silicon-containing layers and the germanium-containing layers;
    selectively removing portions of the germanium-containing layers so that at least one germanium-containing layer remaining between two adjacent silicon-containing layers has a height and the two adjacent silicon-containing layers have a width that is greater than the height; and
    forming a gate electrode layer over exposed surfaces of the silicon-containing layers and the germanium-containing layers.

11. The method of claim 10, wherein the gate electrode layer is formed to fully surround at least one silicon-containing layer.

12. The method of claim 10, wherein the at least one germanium-containing layer between two adjacent silicon-containing layers comprises:
    a first portion in contact with a first silicon-containing layer;
    a second portion in contact with a second silicon-containing layer; and
    a third portion disposed between the first and second portion, wherein the third portion has a width less than a width of the first and second portions.

13. The method of claim 10, wherein at least one germanium-containing layer between two adjacent silicon-containing layers has a width that is less than the height of the silicon-containing layer.

14. A method for forming a semiconductor device structure, comprising:
    forming a fin structure having a stack of semiconductor layers comprising first semiconductor layers and second semiconductor layers alternatingly arranged;
    forming a sacrificial gate structure over a portion of the fin structure;
    removing the first and second semiconductor layers not covered by the sacrificial gate structure;
    forming an epitaxial source/drain feature in the source/drain region;

removing portions of the sacrificial gate structure to expose the first and second semiconductor layers; and selectively removing portions of the second semiconductor layers so that at least one second semiconductor layer remains between two adjacent first semiconductor layers, and the at least one second semiconductor layer has a height and a width that is less than the height.

15. The method of claim 14, wherein the second semiconductor layers at an upper region of the stack of the semiconductor layers has a first germanium atomic percentage, and the second semiconductor layers at a lower region of the stack of the semiconductor layers has a second germanium atomic percentage greater than the first germanium atomic percentage.

16. The method of claim 15, wherein the second semiconductor layers at a middle region of the stack of the semiconductor layers has a third germanium atomic percentage similar or identical to the first germanium atomic percentage.

17. The method of claim 15, wherein the second semiconductor layers at the upper region of the stack of the semiconductor layers has a first width and the second semiconductor layers at the lower region of the stack of the semiconductor layers has a second width less than the first width.

18. The method of claim 14, wherein the at least one second semiconductor layer has a width less than a width of each of the first semiconductor layers.

19. The method of claim 14, further comprising:
after removing portions of the sacrificial gate structure, implanting dopants into the second semiconductor layers.

20. The method of claim 19, wherein the dopants comprise boron (B), phosphorus (P), germanium (Ge), arsenic (As), selenium (Se), bromine (Br), krypton (Kr), silicon (Si), sulfur (S), chlorine (Cl), argon (Ar), or gallium (Ga), or the like, or any combination thereof.

* * * * *